(12) United States Patent
Yamaguchi

(10) Patent No.: US 9,935,625 B2
(45) Date of Patent: Apr. 3, 2018

(54) GATE DRIVE CIRCUIT AND POWER SUPPLY CAPABLE OF REDUCING SURGE VOLTAGE

(71) Applicant: ROHM CO., LTD., Kyoto (JP)

(72) Inventor: Atsushi Yamaguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/233,921

(22) Filed: Aug. 10, 2016

(65) Prior Publication Data
US 2016/0352321 A1   Dec. 1, 2016

Related U.S. Application Data

(63) Continuation of application No. PCT/JP2015/053917, filed on Feb. 13, 2015.

(30) Foreign Application Priority Data

Feb. 14, 2014   (JP) .................. 2014-026297

(51) Int. Cl.
  *H03K 3/00*       (2006.01)
  *H03K 17/0812*    (2006.01)
  (Continued)

(52) U.S. Cl.
  CPC ... *H03K 17/08122* (2013.01); *H01L 29/7391* (2013.01); *H01L 29/866* (2013.01);
  (Continued)

(58) Field of Classification Search
  CPC . H03K 17/08122; H03K 17/162; H02M 1/08; H02M 1/088; H02M 1/4225;
  (Continued)

(56) References Cited

U.S. PATENT DOCUMENTS 4,841,166 A * 6/1989 Harnden ............ H03K 17/0822
                                                    327/108
5,506,539 A * 4/1996 Kelly .................. H03K 17/0822
                                                    327/379
(Continued)

FOREIGN PATENT DOCUMENTS

JP   H09-214311 A   8/1997
JP   H10-248264 A   9/1998
(Continued)

*Primary Examiner* — Kenneth B Wells
(74) *Attorney, Agent, or Firm* — Rabin & Berdo, P.C.

(57) ABSTRACT

The gate drive circuit includes: a gate resistance $R_{G1}$ connected to a gate G1 of a switching device Q1; and a gated diode $D_{G1}$ connected in parallel to the gate resistance $R_{G1}$, wherein a relationship of $V_{th}(Di)<V_{th}(Tr)$ is satisfied, where $V_{th}(Di)$ is a forward threshold voltage of the gated diode $D_{G1}$, and $V_{th}(Tr)$ is a threshold voltage of the switching device Q1. There is provided: a gate drive circuit having high speed switching performance in which a misoperation is suppressed and surge voltage is reduced; and a power supply mounted with such a gate drive circuit.

35 Claims, 27 Drawing Sheets

(51) Int. Cl.

| | |
|---|---|
| *H03K 17/16* | (2006.01) |
| *H01L 29/739* | (2006.01) |
| *H01L 29/866* | (2006.01) |
| *H02M 1/088* | (2006.01) |
| *H02M 1/08* | (2006.01) |
| H02M 1/00 | (2006.01) |
| H01L 27/02 | (2006.01) |
| H01L 29/16 | (2006.01) |
| H01L 29/20 | (2006.01) |
| H02M 1/42 | (2007.01) |
| H02M 3/158 | (2006.01) |
| H02M 7/5387 | (2007.01) |
| H01L 29/423 | (2006.01) |
| H01L 29/778 | (2006.01) |
| H01L 29/06 | (2006.01) |
| H01L 29/10 | (2006.01) |

(52) U.S. Cl.
CPC ............ *H02M 1/08* (2013.01); *H02M 1/088* (2013.01); *H03K 17/162* (2013.01); *H01L 27/0248* (2013.01); *H01L 29/0623* (2013.01); *H01L 29/1066* (2013.01); *H01L 29/1608* (2013.01); *H01L 29/2003* (2013.01); *H01L 29/4236* (2013.01); *H01L 29/7786* (2013.01); *H02M 1/4208* (2013.01); *H02M 1/4225* (2013.01); *H02M 3/158* (2013.01); *H02M 7/5387* (2013.01); *H02M 2001/0054* (2013.01); *Y02B 70/126* (2013.01); *Y02B 70/1491* (2013.01)

(58) Field of Classification Search
CPC .. H02M 1/4208; H02M 7/5387; H02M 3/158; H02M 2001/0054; H01L 29/866; H01L 29/2003; H01L 29/7391; H01L 27/0248; H01L 29/1608; Y02B 70/126; Y02B 70/1491
See application file for complete search history.

(56) References Cited

U.S. PATENT DOCUMENTS

| | | | | |
|---|---|---|---|---|
| 5,635,867 | A * | 6/1997 | Timm | H03K 17/691 327/374 |
| 6,498,437 | B1 * | 12/2002 | Chang | H05B 41/2855 315/119 |
| 6,829,152 | B2 * | 12/2004 | Miura | H01L 29/7803 327/434 |
| 6,847,174 | B2 * | 1/2005 | Franck | H02M 1/38 315/209 R |
| 6,853,149 | B2 * | 2/2005 | Roh | G09G 3/2927 315/169.1 |
| 7,113,412 | B2 * | 9/2006 | Shao | H03K 17/691 327/389 |
| 2013/0155560 | A1 | 6/2013 | Takeuchi | |

FOREIGN PATENT DOCUMENTS

| | | |
|---|---|---|
| JP | 2002-335679 A | 11/2002 |
| JP | 2007-116760 A | 5/2007 |
| JP | 2009-218306 A | 9/2009 |
| JP | 2012-039293 A | 2/2012 |
| JP | 2013-099133 A | 5/2013 |
| JP | 2013-126278 A | 6/2013 |
| JP | 2013-135524 A | 7/2013 |
| JP | 2013-243877 A | 12/2013 |

* cited by examiner

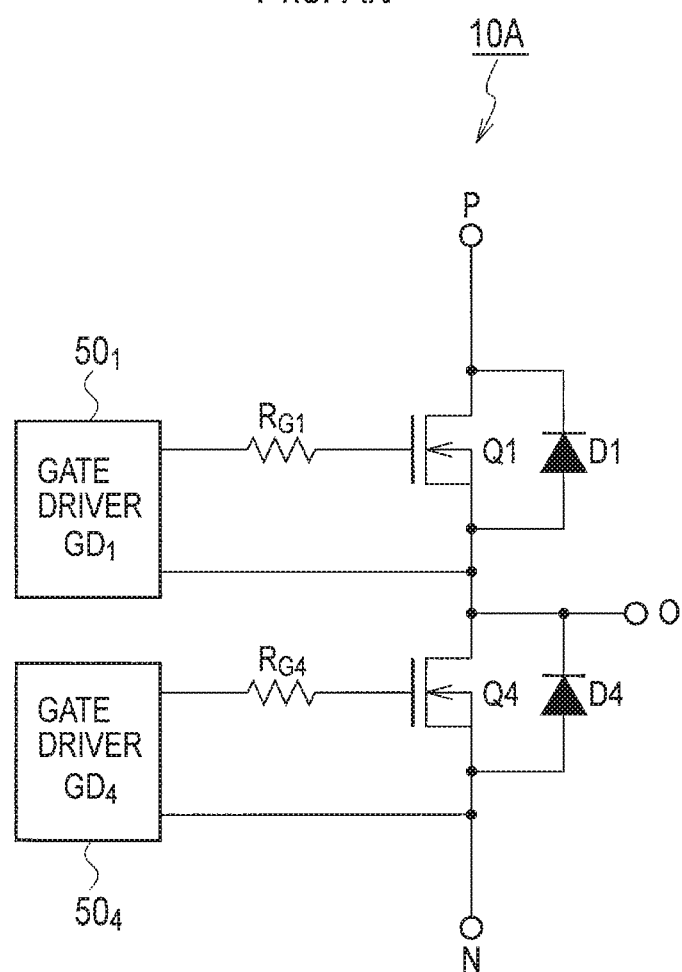

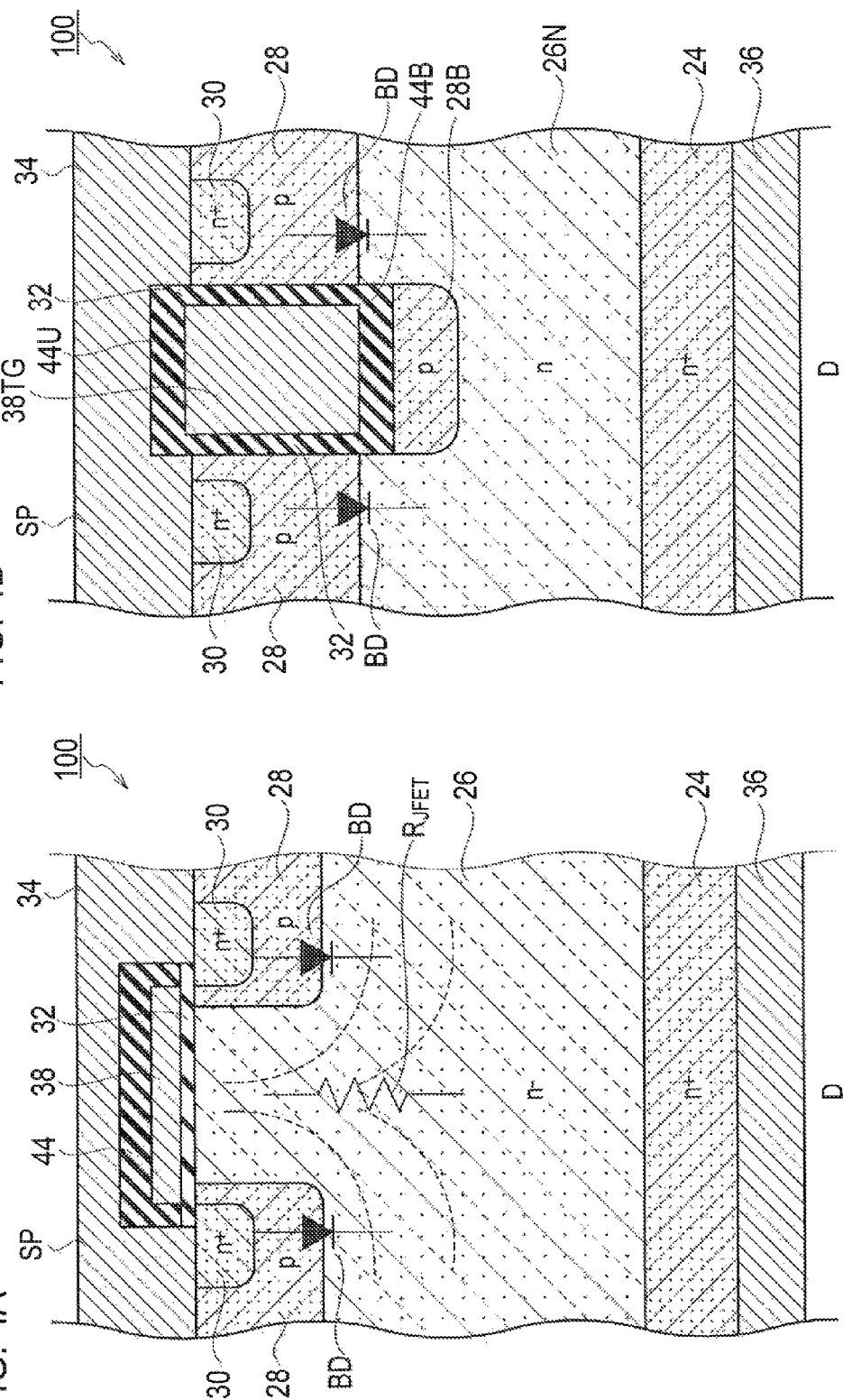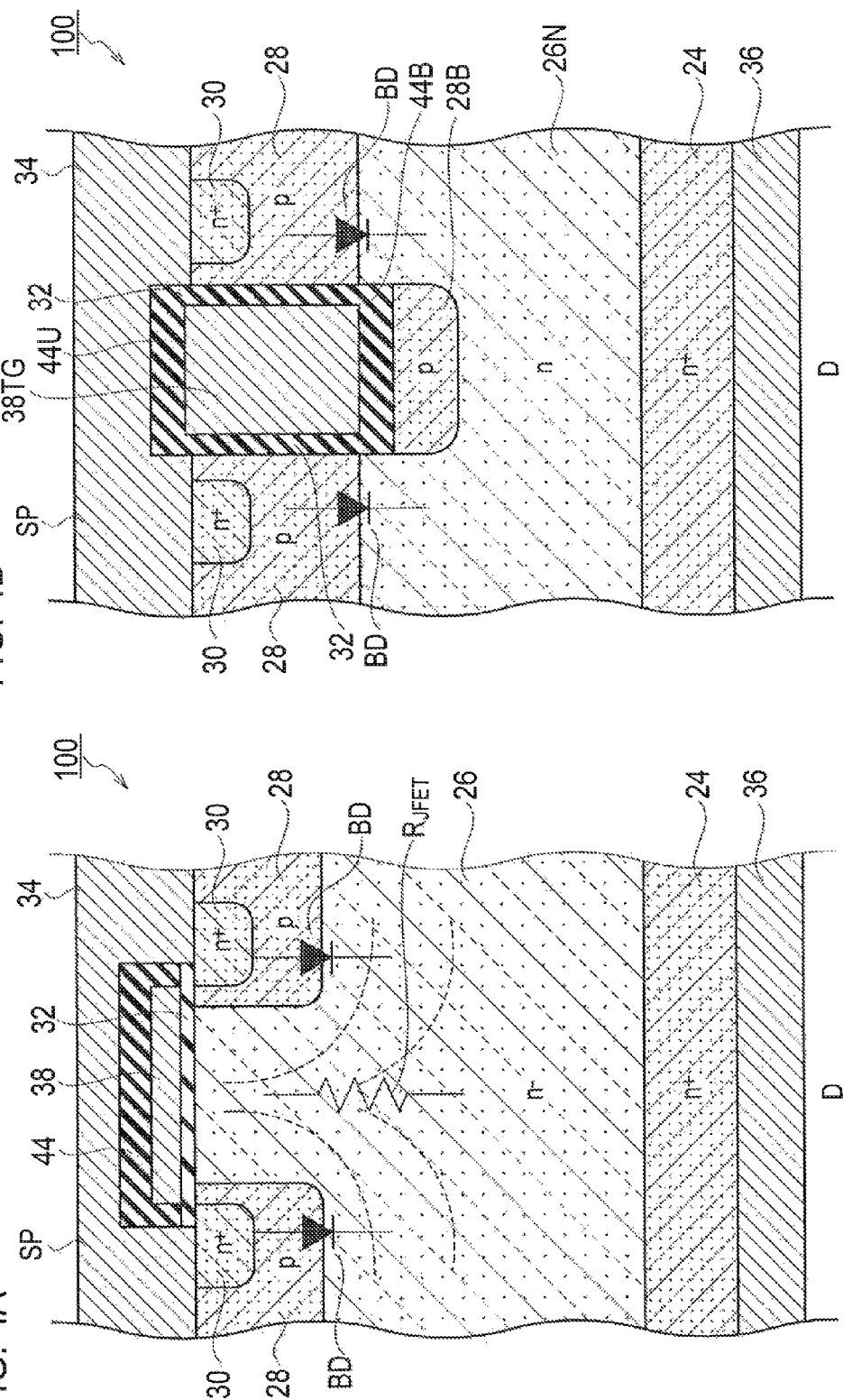

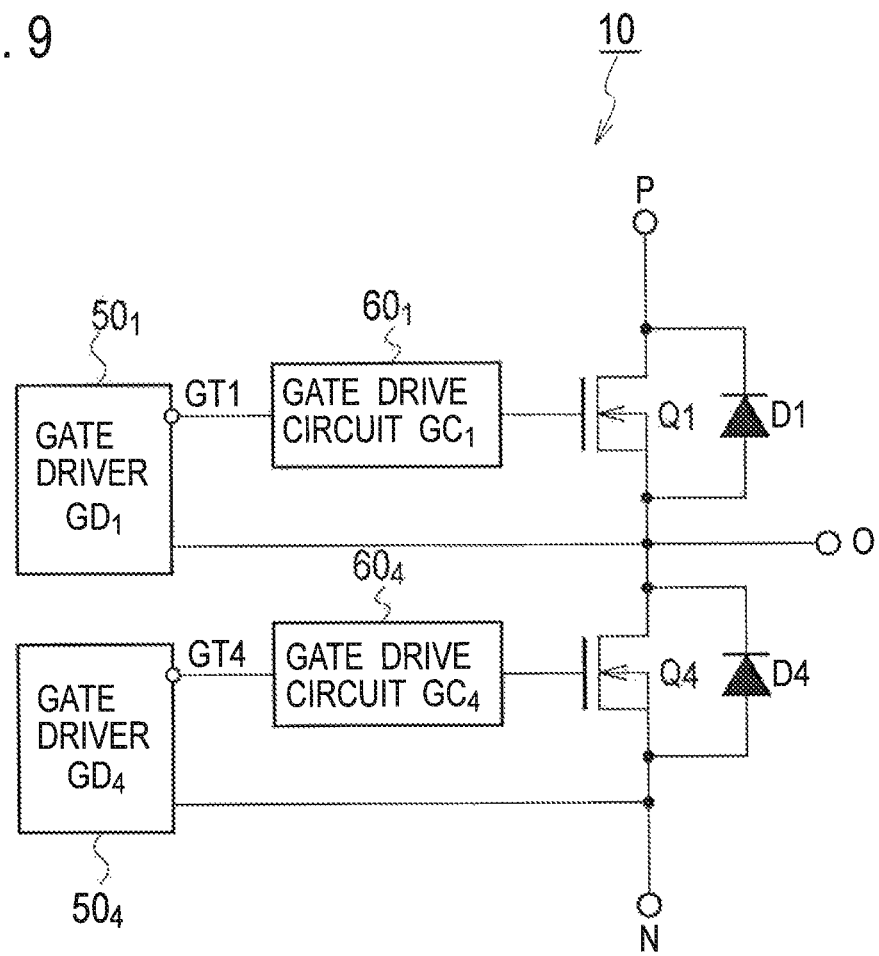

GATE DRIVE CIRCUIT AND POWER SUPPLY CAPABLE OF REDUCING SURGE VOLTAGE

CROSS REFERENCE TO RELATED APPLICATIONS

This is a continuation application (CA) of PCT Application No. PCT/JP2015/53917, filed on Feb. 13, 2015, which claims priority to Japan Patent Application No. P2014-026297 filed on Feb. 14, 2014 and is based upon and claims the benefit of priority from prior Japanese Patent Applications No. P2014-026297 filed on Feb. 14, 2014 and PCT Application No. PCT/JP2015/53917, filed on Feb. 13, 2015, the entire contents of each of which are incorporated herein by reference.

FIELD

The embodiment described herein relates to a gate drive circuit and a power supply. The embodiment relates to in particular a gate drive circuit and a power supply, each capable of reducing surge voltage and reducing erroneous turning-on operations.

BACKGROUND

Many research institutions are currently conducting research to develop Silicon Carbide (SiC) devices, and Gallium Nitride (GaN) devices. Advantages of power devices and GaN power devices over conventional Si power devices include high breakdown voltage, low on resistance, high switching speed, high temperature operation, etc.

Since such new materials devices have comparatively low threshold voltage, and Cgs/Cgd is comparatively small, where Cgs is a capacitance between the gate and the source, and Cgd is a capacitance between the gate and the drain, a remarkable effect may be given, by time differential dVds/dt of the voltage Vds between the drain and the source, to voltage Vgs between the gate and the source via the capacitance Cgd between the gate and the drain. Accordingly, it is easy to be erroneously turned on.

In particular, since Cgs/Cgd is comparatively small in the case of horizontal GaN based High Electron Mobility Transistors (HEMT), vertical GaN based high electron mobility transistors, and SiC Trench Metal-Oxide-Semiconductor Field Effect Transistors (TMOSFET), a remarkable effect may be given, by time differential dVds/dt of the voltage Vds between the drain and the source, to voltage Vgs between the gate and the source via the capacitance Cgd between the gate and the drain, and thereby it is easy to be erroneously turned on.

It is also caused by operating conditions of new materials devices being high voltage and high speed driving.

If transistors are driven at high voltage or at high speed, the voltage Vds between the drain and the source and the drain current Id will be largely changed. As a consequence, time differential dVds/dt and dId/dt is increased. Accordingly, this is fed back to the capacitance Cgd between the gate and the drain, and thereby causes rise of the voltage Vgs between the gate and the source.

It is effective to reduce the gate resistance in order to prevent such phenomenon, while it is traded off in a circuit which needs to reduce surge voltage by the gate resistance.

SUMMARY

The embodiment provides: agate drive circuit having high speed switching performance in which a misoperation is suppressed and surge voltage is reduced; and a power supply mounted with such a gate drive circuit.

According to one aspect of the embodiment, there is provided a gate drive circuit comprising: a gate resistance connected to a gate of a switching device; and a gated diode connected in parallel to the gate resistance, wherein a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device.

According to another aspect of the embodiment, there is provided a power supply comprising: a first switching device of which a first drain is connected to a positive-side power terminal; a second switching device of which a second drain is connected to a first source of the first switching device, the second drain connected to an output terminal, the second switching device of which a second source is connected to a negative-side power terminal; and the above-mentioned gate drive circuit connected to both of or any one of an first gate of the first switching device and a second gate of the second switching device.

According to still another aspect of the embodiment, there is provided a power supply comprising: a switching device configured to control an ON/OFF state; a gate driver configured to drive the switching device by applying voltage to a gate of the switching device; a gate resistance disposed between the gate and the gate driver; and a gated diode connected in parallel to the gate resistance, the gated diode connected between the gate and the gate driver so that an anode is at a gate side of the switching device and a cathode is at a gate driver side, wherein a relationship between a threshold voltage $V_{th}(Di)$ of the gated diode and a threshold voltage $V_{th}(Tr)$ of the switching device satisfy $V_{th}(Di)<V_{th}(Tr)$.

According to yet another aspect of the embodiment, there is provided a power supply comprising: a switching device configured to control an ON/OFF state; a gate driver configured to drive the switching device by applying voltage to a gate of the switching device; a gate resistance disposed between the gate and the gate driver; and a gate switching device connected in parallel to the gate resistance, the gate switching device connected between the gate and the gate driver so that a source is at a gate side of the switching device and a drain is at a gate driver side, wherein a relationship between a threshold voltage $V_{th}(TrG)$ of the gate switching device and a threshold voltage $V_{th}(Tr)$ of the switching device satisfy $V_{th}(TrG)<V_{th}(Tr)$.

According to the embodiment, there can be provided the gate drive circuit having high speed switching performance in which the misoperation is suppressed and the surge voltage is reduced; and the power supply mounted with such a gate drive circuit.

BRIEF DESCRIPTION OF DRAWINGS

FIG. 1 is a schematic circuit configuration diagram of a half bridge circuit, in a power supply according to a comparative example.

FIG. 4A is a schematic cross-sectional structure diagram of SiC Double Implanted (DI) MOSFET, in an example of a semiconductor device applicable to the gate drive circuit and the power supply according to the embodiment.

FIG. 4B is a schematic cross-sectional structure diagram of SiC Trench (T) MOSFET, in an example of the semiconductor device applicable to the gate drive circuit and the power supply according to the embodiment.

FIG. 9 is a schematic circuit configuration diagram of a half bridge circuit including a gate drive circuit $GC_1$ and a gate drive circuit $GC_4$, in the power supply according to the embodiment.

DESCRIPTION OF EMBODIMENTS

Figure 2A:
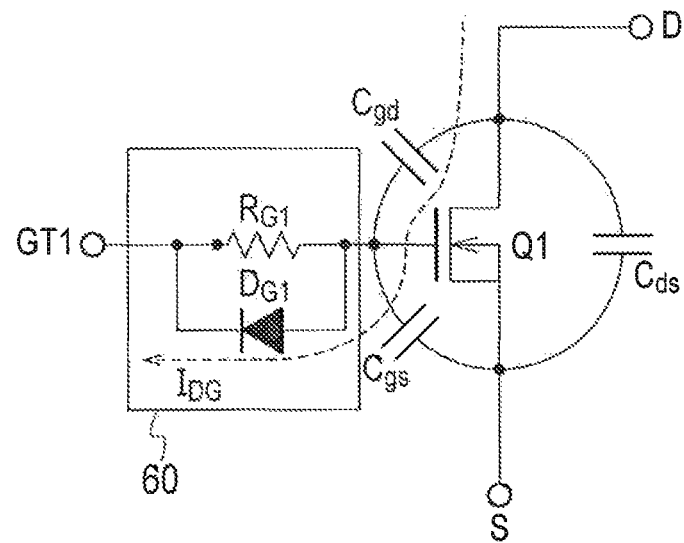
FIG. 2A is an explanatory diagram of a parasitic effect of a switching device to which a gate drive circuit according to an embodiment is applied.

Next, a certain embodiment will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiment described hereinafter merely exemplifies the device and method for materializing the technical idea; and the embodiment does not specify the material, shape, structure, placement, etc. of each component part as the following. The embodiment may be changed without departing from the spirit or scope of claims.

Comparative Examples

As shown in FIG. 1, a power supply 10A according to a comparative example includes: a first switching device Q1 of which a first drain is connected to a positive-side power terminal P; a second switching device Q4 of which a second drain connected to an output terminal O is connected to a first source of a first switching device Q1, the second switching device Q4 of which a second source is connected to a negative-side power terminal N; a gate resistance $R_{G1}$ connected to a first gate of the first switching device Q1, and a gate resistance $R_{G4}$ connected to a second gate of the second switching device Q4; a first gate driver (GD$_1$) 50$_1$ connected between the first gate and the first source of the first switching device Q1 through the gate resistance $R_{G1}$, the first gate driver (GD$_1$) 50$_1$ configured to drive the first gate switching device Q1; and a second gate driver (GD$_4$) 50$_4$ connected between the second gate and the second source of the second switching device Q4 through the gate resistance $R_{G4}$, the second gate driver (GD$_4$) 50$_4$ configured to drive the second switching device Q4.

The power supply 10A further includes: a snubber diode D1 connected in reversely parallel between the first drain and the first source of the first gate switching device Q1; and a snubber diode D4 connected in reversely parallel between the second drain and the first source of the second switching device Q4.

In the embodiment, the first gate switching device Q1 and the second switching device Q4 are connected in series between the positive-side power terminal P and the negative-side power terminal N, and thereby forms a half-bridge type inverter.

In the power supply 10A according to the comparative example, a surge voltage can be reduced by the gate resistances $R_{G1}$, $R_{G4}$ provided as a gate drive circuit, as shown in FIG. 1.

On the other hand, if the switching devices Q1, Q4 are driven at high voltage or at high speed, the voltage Vds between the drain and the source and the drain current Id will be largely changed. As a consequence, time differential dVds/dt and dId/dt is increased and then this is fed back to the capacitance Cgd between the gate and the drain, and thereby causes rise of the voltage Vgs between the gate and the source. It is effective to reduce the gate resistances $R_{G1}$, $R_{G4}$ in order to prevent such phenomenon, while it is traded off in a circuit which needs to reduce surge voltage by the gate resistance.

First Embodiment

FIG. 2A shows an explanatory diagram of a parasitic effect produced by a switching device Q1 to which a gate drive circuit 60 according to the embodiment is applied.

Figure 2B:
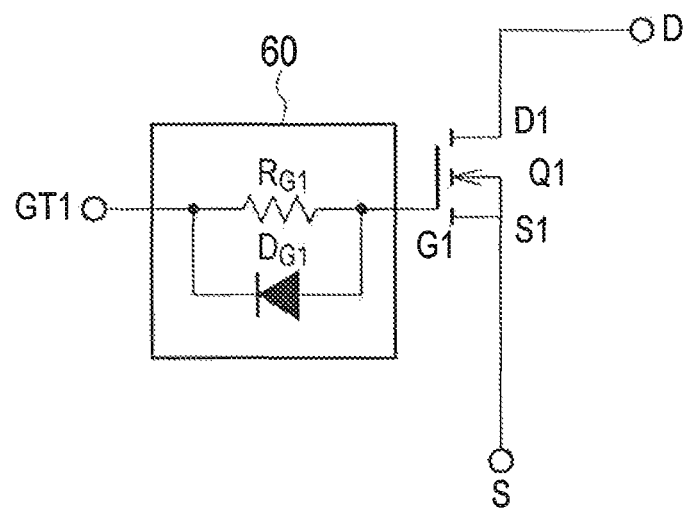
FIG. 2B is a schematic circuit configuration diagram of the gate drive circuit according to the embodiment.

FIG. 2B shows a schematic circuit configuration of the gate drive circuit according to the embodiment.

FIG. 2A shows a capacitance Cgs between the gate and the source, a capacitance Cgd between the gate and the drain, and a capacitance Cds between the drain and the source of the switching device Q1 to which the gate drive circuit 60 according to the embodiment is applied. Symbol marks of the switching device Q1 shown in FIGS. 2A and 2B respectively express equivalent elements. In the following explanation, one of the symbol marks will be appropriately used on account of the explanation.

As shown in FIG. 2B, the gate drive circuit 60 according to the embodiment includes: a gate resistance $R_{G1}$ connected to a gate of the switching device Q1; and a gated diode $D_{G1}$ connected in parallel to the gate resistance $R_{G1}$, wherein a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device.

Moreover, a relationship of $R_{on}<R_G$ is satisfied, where $R_{on}$ is a value of on-resistance of the switching device Q1, and $R_G$ is a value of the gate resistance $R_{G1}$.

In the embodiment, as shown in FIG. 2B, an anode of the gated diode $D_{G1}$ is connected to a gate G1 of the switching device Q1, and a cathode of the gated diode DG1 is connected to a gate terminal GT1 at the side of the gate driver.

Moreover, a value $R_G$ of the gate resistance $R_{G1}$ can be expressed with $R_G$=Rgi+Rge, where Rgi is an internal resistance of the gate itself in the switching device Q1, and Rge is an external resistance to be appropriately added thereto as required.

Since the gate drive circuit 60 according to the embodiment includes the gate resistance $R_{G1}$, as shown in FIG. 2B, the surge voltage can be reduced by the gate resistance $R_{G1}$.

Moreover, since the gate drive circuit 60 according to the embodiment includes a gated diode $D_{G1}$ connected in parallel to the gate resistance $R_{G1}$, a rise amount of the voltage Vgs between the gate and the source can be conducted through the gated diode $D_{G1}$, as shown with the electric current $I_{DG}$ in FIG. 2A, and thereby an unintended erroneous turning-on of the switching device Q1 can be prevented.

(Operation at the Time of Switching)

Figure 3A:
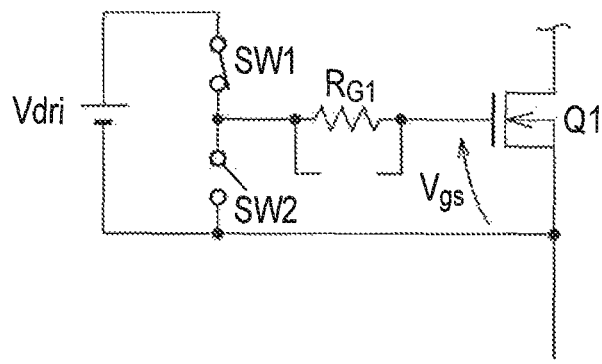
FIG. 3A is a circuit explanatory diagram of switching operation from OFF to ON, in an operation explanation of the gate drive circuit according to the embodiment.
Figure 3B:
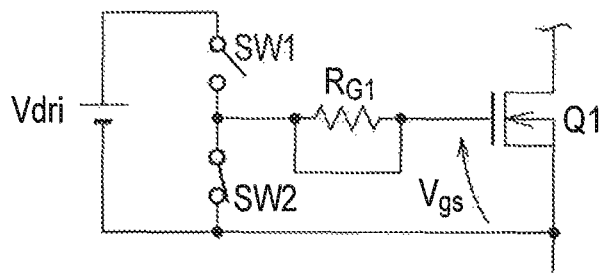
FIG. 3B is a circuit explanatory diagram of switching operation from ON to OFF, in an operation explanation of the gate drive circuit according to the embodiment.
Figure 3C:
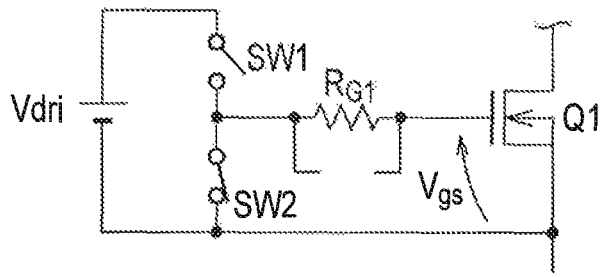
FIG. 3C is a circuit explanatory diagram of switching operation from ON to OFF on different condition from that of FIG. 3B, in an operation explanation of the gate drive circuit according to the embodiment.

FIG. 3A shows a circuit explanatory diagram of a switching operation from OFF to ON, in an operation explanation for the gate drive circuit according to the embodiment, FIG. 3B shows a circuit explanatory diagram of the switching operation from ON to OFF, and FIG. 3C shows a circuit explanatory diagram of the switching operation from ON to OFF on a condition different from FIG. 3B.

—Switching Operation from OFF to ON—

In the switching operation from OFF to ON, as shown in FIG. 3A, switches (SW1, SW2) in a gate driver are switched from (OFF, ON) state to (ON, OFF) state. Since a reverse bias is applied to the gated diode $D_{G1}$ when the switches (SW1, SW2) are (ON, OFF) state, the gated diode $D_{G1}$ is shifted to a non-conductive (OFF) state, and then is charged from the driver power supply Vdri (power supply voltage EV) through the gate resistance $R_{G1}$ until the capacitance Cgs between the gate and the source of the switching device Q1 is shifted from the state of Vgs=0V to the state of Vgs=EV, as shown in FIG. 3A.

—Switching Operation from ON to OFF—

In the switching operation from ON to OFF, as shown in FIG. 3B, the switches (SW1, SW2) in the gate driver are switched from (ON, OFF) state to (OFF, ON) state. Since the voltage Vgs between the gate and the source of the switching device Q1 is in a state higher than the threshold voltage Vth(Di) of the gated diode $D_{G1}$, i.e., since a forward bias is applied to the gated diode $D_{G1}$ during Vgs>=Vth(Di), the gated diode $D_{G1}$ is shifted to a conducting (ON) state, and then is discharged through the gated diode $D_{G1}$ until the capacitance Cgs between the gate and the source of the switching device Q1 is shifted from the state of Vgs=EV to the state of Vgs>=Vth(Di), as shown in FIG. 3B.

—Switching Operation from ON to OFF—

If the voltage Vgs between the gate and the source of the switching device Q1 becomes a state lower than the threshold voltage Vth(Di) of the gated diode $D_{G1}$, i.e., the state of Vgs<Vth(Di), since the forward bias Vgs of the switching device Q1 becomes smaller than the threshold voltage Vth(Di) of the gated diode $D_{G1}$, the gated diode $D_{G1}$ is shifted to the non-conductive (OFF) state, and then is discharged through the gate resistance $R_G$ until the capacitance Cgs between the gate and the source of the switching device Q1 is shifted from the state of Vgs<Vth(Di) to the state of Vgs=0V, as shown in FIG. 3C.

(Configuration Example of Semiconductor Device)

—SiC DIMOSFET—

As shown in FIG. 4A, an SiC Double Implanted (DI) MOSFET applicable to the gate drive circuit and the power supply according to the embodiment includes: a semiconductor substrate 26 including an n⁻ type high resistivity layer; a p body region 28 formed on a front surface side of the semiconductor substrate 26; an n⁺ source region 30 formed on a front side surface of the p body region 28; a gate insulating film 32 disposed on a front side surface of the semiconductor substrate 26 between the p body regions 28; a gate electrode 38 disposed on the gate insulating film 32; a source electrode 34 connected to the source region 30 and the p body region 28; an n⁺ drain region 24 disposed on a back side surface opposite to the surface of the semiconductor substrate 26; and a drain electrode 36 connected to the n⁺ type drain area 24.

In the semiconductor device 120 shown in FIG. 4A, the p body region 28 and the n⁺ source region 30 formed on the front side surface of the p body region 28 are formed with double ion implantation (DI), and the source pad electrode SP is connected to the source region 30 and the source electrode 34 connected to the p body region 28. A gate pad electrode GP (not shown) is connected to the gate electrode 38 disposed on the gate insulating film 32. Moreover, as shown in FIG. 4A, the source pad electrode SP and the gate pad electrode GP (not shown) are disposed on an interlayer insulating film 44 for passivation configured to cover the front side surface of the semiconductor device 100.

As shown in FIG. 4A, in the SiC DIMOSFET, since a depletion layer as shown with the dashed lines is formed in the semiconductor substrate 26 composed of a n⁻ type high resistivity layer inserted into the p body regions 28, a channel resistance $R_{JFET}$ accompanying the junction type FET (JFET) effect is formed. Moreover, the body diode BD is formed between p body region 28 and the semiconductor substrate 26 and the n+ type drain region 24, as shown in FIG. 4A.

—SiC TMOSFET—

As shown in FIG. 4B an SiC TMOSFET applicable to the gate drive circuit and the power supply according to the embodiment includes: a semiconductor substrate 26N including an n layer; a p body region 28 formed on a front surface side of the semiconductor substrate 26N; an n⁺ source region 30 formed on a front side surface of the p body region 28; a trench gate electrode 38TG passing through the p body region 28, the trench gate electrode 38TG formed in a trench formed up to the semiconductor substrate 26N via a gate insulating film 32 and an interlayer insulating films 44U, 44B; an embedding p body region 28B formed in a bottom of the trench gate electrode 38TG through an interlayer insulating film 44B; a source electrode 34 connected to the source region 30 and the p body region 28; an n$^+$ type drain area 24 disposed on a back side surface of the semiconductor substrate 26N opposite to the front side surface thereof; and a drain pad electrode 36 connected to the n$^+$ drain region 24.

In the semiconductor device 100 shown in FIG. 4B, a trench gate electrode 38TG passes through the p body region 28, and the trench gate electrode 38TG formed in the trench formed up to the semiconductor substrate 26N is formed via the gate insulating film 32 and the interlayer insulating films 44U, 44B, and the source pad electrode SP is connected to the source region 30 and the source electrode 34 connected to the p body region 28. A gate pad electrode GP (not shown) is connected to the gate electrode 38 disposed on the gate insulating film 32. Moreover, as shown in FIG. 4B, the source pad electrode SP and the gate pad electrode GP (not shown) are disposed on an interlayer insulating film 44U for passivation configured to cover the front side surface of the semiconductor device 100.

In the SiC TMOSFET, no channel resistance $R_{JFET}$ accompanying the junction type FET (JFET) effect as the SiC DIMOSFET is formed. Moreover, body diodes BD are respectively formed between the p body regions 28 and the semiconductor substrates 26, in the same manner as FIG. 4A.

—GaN Based HEMT—

Nitride based semiconductor devices, e.g. a GaN based HEMT, are also applicable to the semiconductor devices 100 (Q1, Q4) applicable to the gate drive circuit and the power supply according to the embodiment, instead of the SiC based MOSFET. GaN, AlGaN, InGaN, etc. are applicable, as a nitride based semiconductor.

Figure 5A:
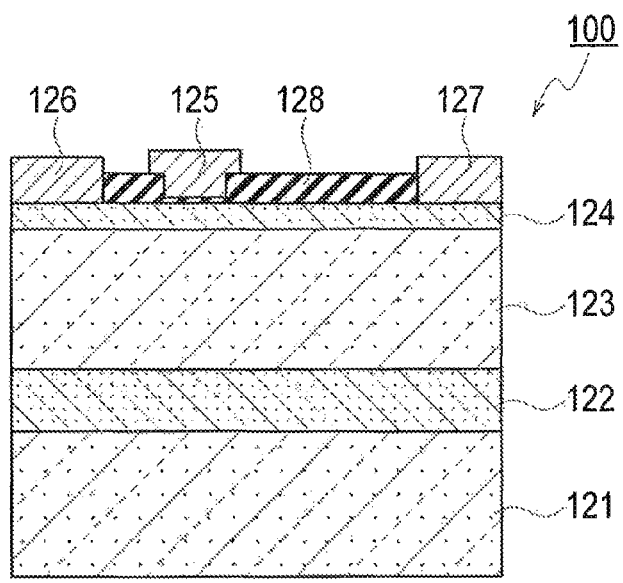
FIG. 5A is a cross-sectional diagram showing a structure of a GaN based HEMT applicable to the gate drive circuit and the power supply according to the embodiment.
Figure 5B:
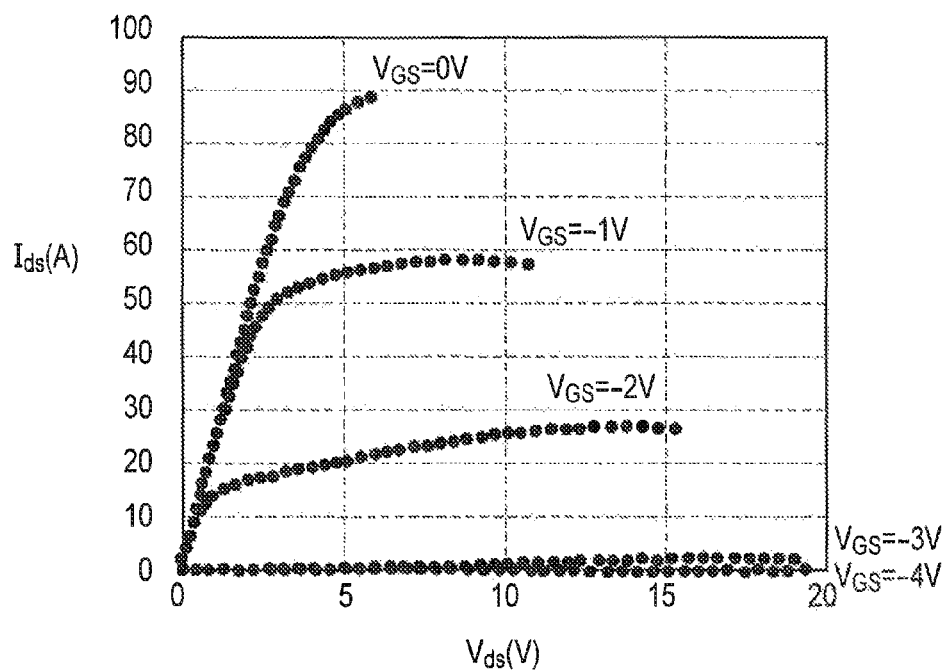
FIG. 5B is a drain voltage-drain current characteristics diagram of the GaN based HEMT shown in FIG. 5A.

FIG. 5A shows a schematic cross-sectional structure of the GaN based HEMT (for example, including AlGaN/GaN heterostructure) 100 applicable to the gate drive circuit and the power supply according to the embodiment, and drain voltage-drain current characteristics are expressed as shown in FIG. 5B.

As shown in FIG. 5A, the GaN based HEMT 100 includes: a buffer layer 122 formed on an Si substrate 121, for example, and including GaN etc.; a channel layer 123 formed on the buffer layer 122 and including an undoped GaN layer; and an electron supply layer 124 formed on the channel layer 123 and including an undoped AlGaN.

A gate electrode 125, a drain electrode 127, and an insulation layer 128 via a source electrode 126 are formed on the electron supply layer 124.

In the GaN based semiconductor device 100, since the electron supply layer 124 including the undoped AlGaN is joined by heterojunction to a front side surface of the channel layer 123 including the undoped GaN, Two Dimensional Electron Gas (2DEG) is formed in an interface of the joined portion. Accordingly, electrons in the 2DEG layer serve as a carrier, and then the channel layer 123 will have electrical conductivity.

FIG. 5B shows normally-on type drain voltage-drain current characteristics. More specifically, as shown in FIG. 5B, the drain current Ids flows even in a state where the gate voltage $V_{GS}$ is 0V. On the other hand, the drain current Ids will not gradually flow in accordance with applying negative voltages ($V_{GS}$=−1V, −2V, −3V, −4V in FIG. 5B) as the gate voltage $V_{GS}$, and then the drain current Ids becomes substantially OA in a state where the gate voltage $V_{GS}$ is −4V, in the example shown in FIG. 5B. Although FIG. 5B shows an example of the normally-on type drain voltage-drain current characteristics, a normally-off type devices can also be adopted by modifying the channel structure of the GaN based HEMT. A value of the threshold voltage V(Tr) is a negative value in the normally-on type GaN device, and a value of the threshold voltage V(Tr) is a positive value, in the normally-off type GaN device.

Figure 6A:
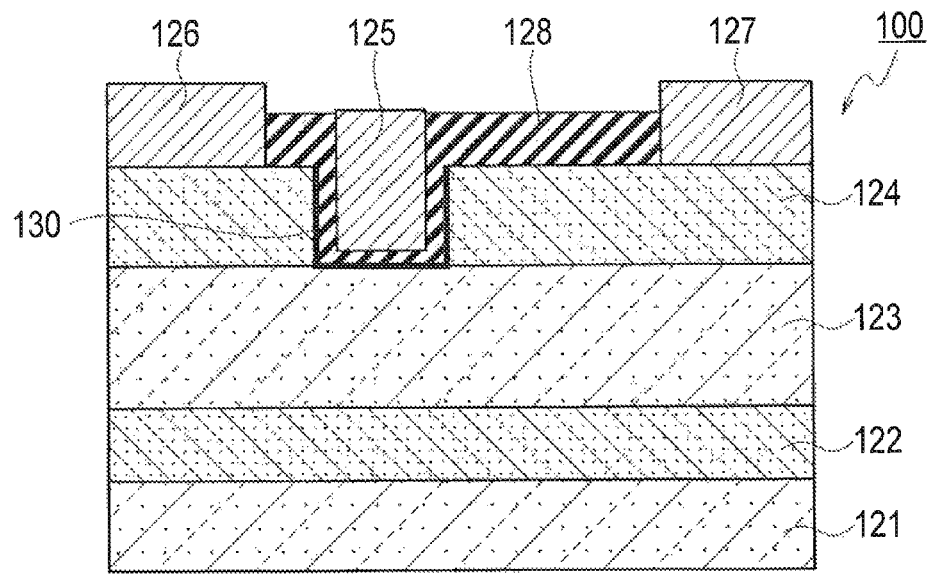
FIG. 6A is a cross-sectional diagram showing another structure of the GaN based HEMT applicable to the gate drive circuit and the power supply according to the embodiment.
Figure 6B:
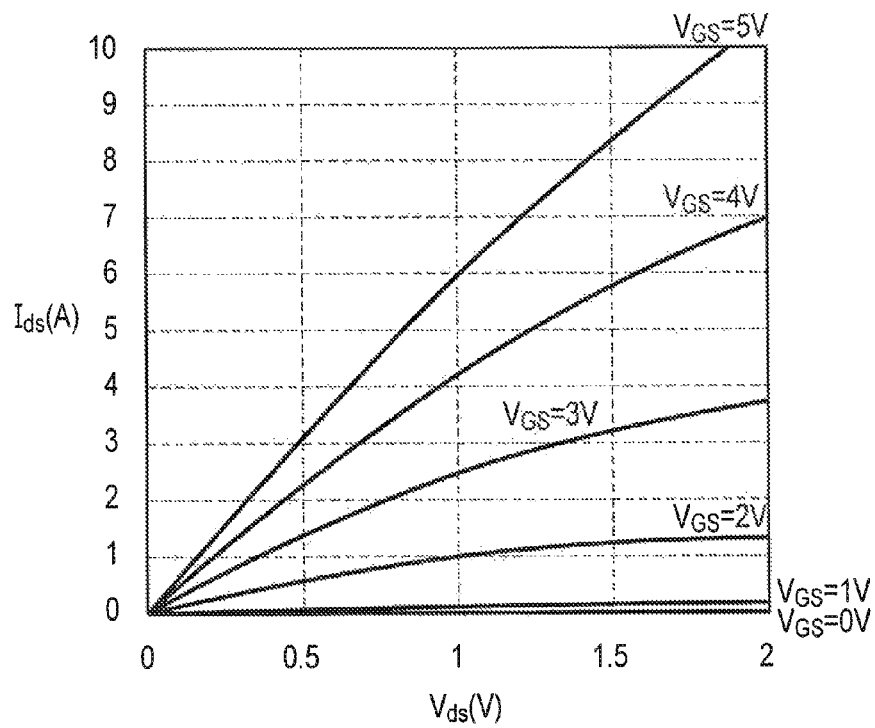
FIG. 6B is a drain voltage-drain current characteristics diagram of the GaN based HEMT shown in FIG. 6A.

FIG. 6A shows anther schematic cross-sectional structure of the GaN based HEMT (for example, including AlGaN/GaN heterostructure) 100 applicable to the gate drive circuit and the power supply according to the embodiment, and drain voltage-drain current characteristics are expressed as shown in FIG. 6B.

In the configuration example shown in FIG. 6A, a trench groove 130 is formed with respect to the electron supply layer 124 including the undoped AlGaN, and then the gate electrode 125 is filled into with respect to a bottom surface and a sidewall of the trench groove 130 via the insulation layer 128. Other configurations are the same as those shown in FIG. 5A.

In the configuration example shown in FIG. 6A, the normally-off type characteristics of the 2DEG layer of the interface between the AlGaN layer (124) and the GaN layer (123) at a lower side of the gate electrode 125 are realized by forming the gate electrode 125 via the insulation layer 128 in the trench groove 130 formed with respect to the electron supply layer 124 including the undoped AlGaN.

FIG. 6B shows the drain voltage-drain current characteristics of the normally-off type. More specifically, as shown in FIG. 6B, the drain current Ids is shifted to OFF state when the gate voltage $V_{GS}$ is 0V, and the drain current Ids gradually increases in accordance with applying positive voltages ($V_{GS}$=−1V, 2V, 3V, 4V, 5V in FIG. 6B) as the gate voltage $V_{GS}$.

Figure 7A:
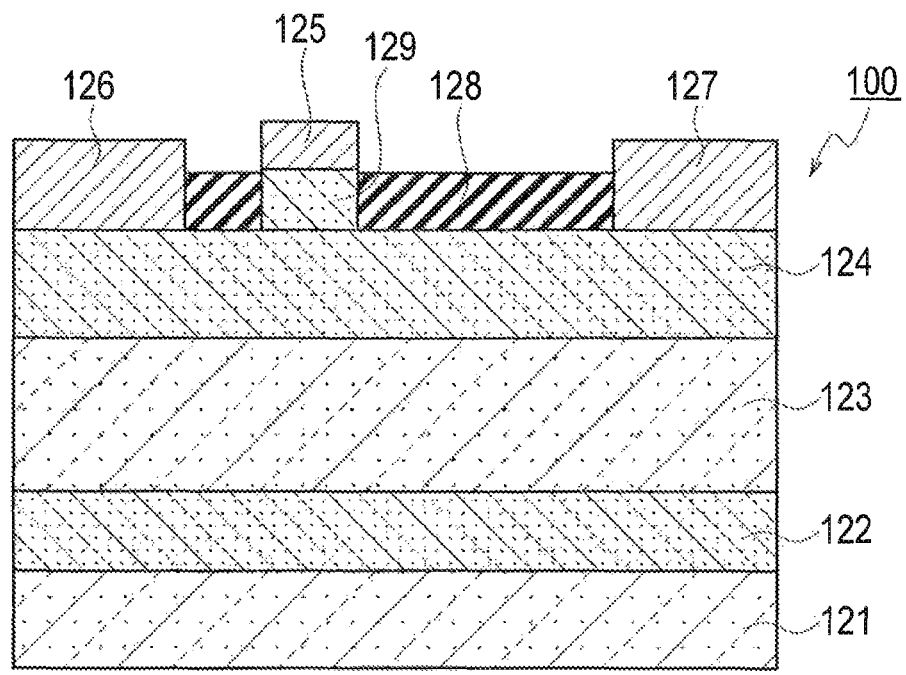
FIG. 7A is a cross-sectional diagram showing still another structure of the GaN based HEMT applicable to the gate drive circuit and the power supply according to the embodiment.

FIG. 7A shows anther schematic cross-sectional structure of the GaN based HEMT (for example, including AlGaN/GaN heterostructure) 100 applicable to the gate drive circuit and the power supply according to the embodiment.

In the configuration example shown in FIG. 7A, the p-type GaN layer 129 is formed with respect to the electron supply layer 124 including the undoped AlGaN, and the gate electrode 125 is connected to the p-type GaN layer 129. Other configurations are the same as those shown in FIG. 5A. In the configuration example shown in FIG. 7A, the normally-off type characteristics of the 2DEG layer of the interface between the AlGaN layer (124) and the GaN layer (123) at a lower side of the gate electrode 125 via the AlGaN layer 124 are realized by forming the p-type GaN layer 129 with respect to the electron supply layer 124 including the undoped AlGaN. The characteristics of the drain voltage-drain current characteristics are obtained as the same as that in FIG. 6B.

Figure 7B:
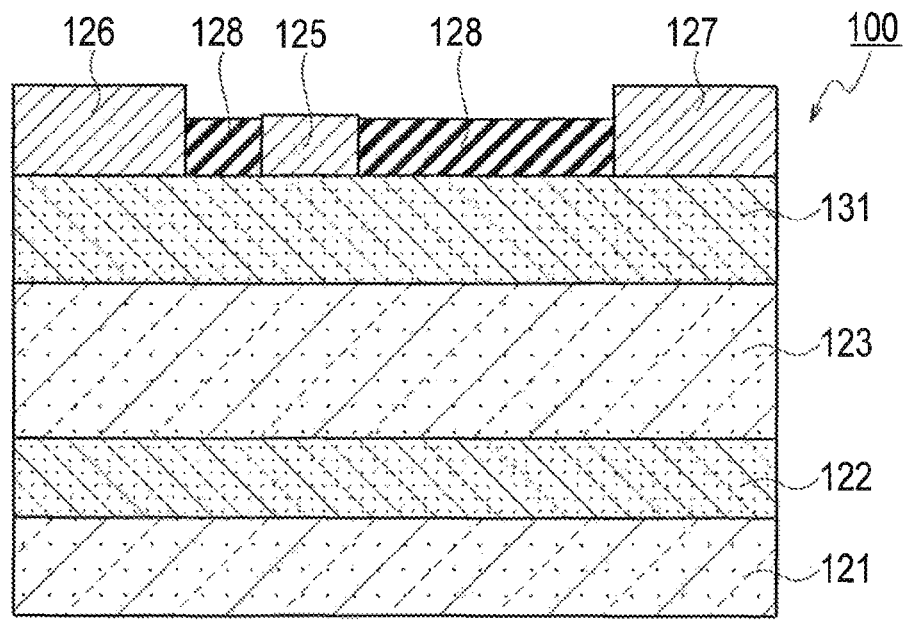
FIG. 7B is a cross-sectional diagram showing yet another structure of the GaN based HEMT applicable to the gate drive circuit and the power supply according to the embodiment.

FIG. 7B shows anther schematic cross-sectional structure of the GaN based HEMT (for example, including AlN/GaN heterostructure) 100 applicable to the gate drive circuit and the power supply according to the embodiment.

In the configuration example shown in FIG. 7B, the normally-off type characteristics of the 2DEG layer of the interface between the AlN layer (131) and the GaN layer (123) at a lower side of the gate electrode 125 are realized by forming the gate electrode 125 by Schottky junction with respect to the electron supply layer 131 including the undoped AlN. The characteristics of the drain voltage-drain current characteristics are obtained as the same as that in FIG. 6B.

Any one of the SiC based power device, GaN based power device or AlN based device is applicable to the semiconductor device 100 (Q1, Q4) applicable to the gate drive circuit and the power supply according to the embodiment. Moreover, any one of the normally-off type device or the normally-on type device is applicable to the gate drive circuit and the power supply according to the embodiment.

Furthermore, a semiconductor of which the bandgap energy is from 1.1 eV to 8 eV, for example, can be used for the semiconductor device 110 (Q1, Q4) applied to the gate drive circuit and the power supply according to the embodiment.

(Electric Field Distribution)

Figure 8A:
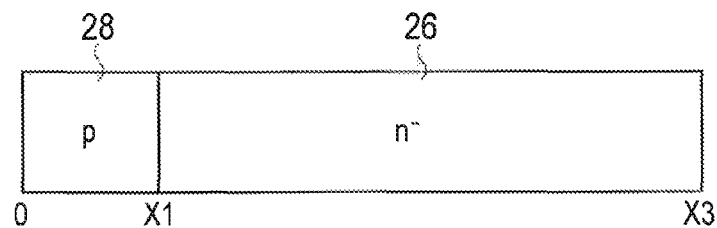
FIG. 8A is a schematic diagram of a p body region and an n drift layer of Si MISFET, in a comparison between the Si device and the SiC device.
Figure 8B:
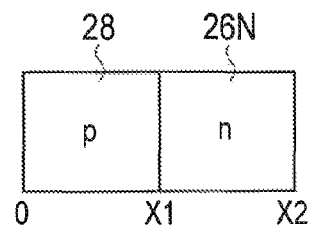
FIG. 8B is a schematic diagram of a p body region and an n drift layer of the SiC MISFET, in the comparison between the Si device and the SiC device.

Since the SiC device has high dielectric breakdown electric fields (for example, being approximately 3MV/cm, and approximately 3 times of Si), it can secure a breakdown voltage even if a layer thickness of the drift layer is formed thinner and the impurity concentration thereof is set higher than those of the Si. FIG. 8A is a schematic diagram of a p body region 28 and an n⁻ drift layer 26 of the Si MISFET, in a comparison between an Si device and an SiC device. FIG. 8B shows a schematic diagram of the p body region 28 and the drift layer 26N in the SiC MISFET. Moreover, the field intensity distribution corresponding to FIGS. 8A and 8B is schematically expressed as shown in FIG. 8C.

Figure 8C:
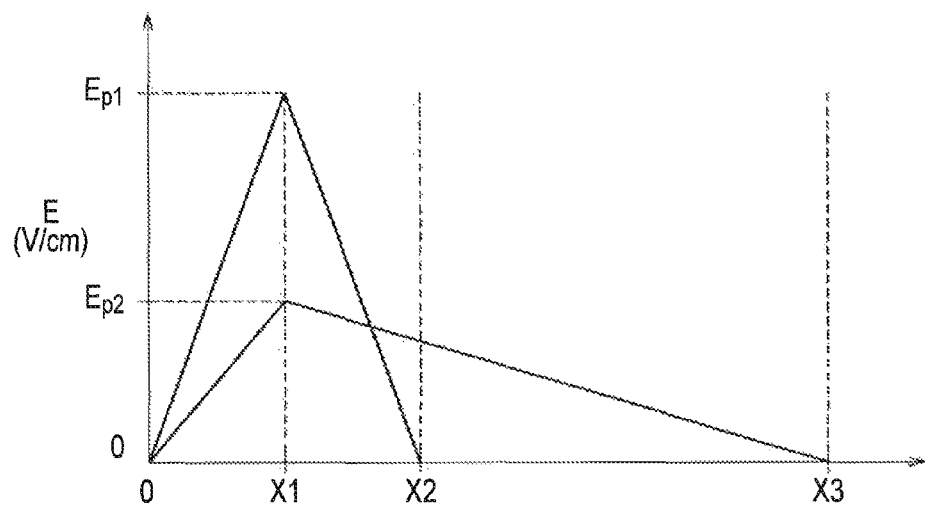
FIG. 8C is a comparative diagram between the field intensity distributions respectively corresponding to FIGS. 8A and 8B.

As shown in FIG. 8C, peak electric field intensity $E_{p2}$ of the Si MISFET can be obtained from a position of the distance X1 measured from a junction interface between the p body region 28 and the n⁻ drift layer 26 (i.e., front side surface of the p body region 28). Similarly, peak electric field intensity $E_{p1}$ of the SiC MISFET can be obtained from a position of the distance X1 measured from a junction interface between the p body region 28 and the n drift layer 26N (i.e., front side surface of the p body region 28). Due to a difference between the dielectric breakdown electric fields, the peak electric field intensity $E_{p1}$ of the SiC MISFET can be set up higher than the peak electric field intensity $E_{p2}$ of the Si MISFET.

Moreover, while an expansion width of the depletion layer in the Si MISFET is a range of the distance X1-X3 measured from the front side surface of the p body region 28, an expansion width of the depletion layer in the Si MISFET is a range of the distance X1-X2 measured from the front side surface of the p body region 28. Accordingly, the required layer thickness of the n⁻ drift layer is small, a resistance value of the n⁻ drift layer can be reduced due to a merit of both sides of impurity concentration and the layer thickness, the on resistance $R_{on}$ can be made low, and thereby the chip area can be reduced (the chip size can be reduced). Since the breakdown voltage which may equal to that of the Si IGBT can be realized as in the MISFET structure which is a unipolar device, high breakdown voltages and high speed switching can be realized, and thereby reduction of switching power loss can be expected.

On the other hand, there is a demerit of being hard to reduce the output capacitance and feedback capacitance since the high concentration and thin-layer (X2<X3) of the drift layers 26, 26N limit the expansion width of depletion layer.

Furthermore, the demerit in particular appears notably in the SiC TMISFET having no Junction FET (JFET) structure in the current path fundamentally, and therefore the reduction of on resistance $R_{on}$ and the ease of the erroneous turning-on are traded off with each other, thereby inhibiting the high-speed response performance of the SiC based MISFET. Moreover, if the structure of GaN HEMT is a horizontal device, a ratio of Cgs:Cgd is smaller than that of Si, and an erroneous turning-on (misfiring (erroneous firing)) easily occurs.

From this reason, the gate drive circuit according to the embodiment which uses the SiC based device or the GaN based device as the switching device, and the power supply mounted with such a gate drive circuit can reduce the surge voltage and can suppress the misoperation, and thereby can obtain high speed switching performance.

The gate drive circuit according to the embodiment and the power supply mounted with such a gate drive circuit can prevent causing an intended switching operation and which is not or an electrical overload to the switching device when the switching device specified by the pulse signal from the gate drive circuit executes the switching operation, in the circuit including the switching device having the gate electrode for controlling the ON/OFF state and the gate drive circuit for driving such a switching device.

(Power Supply: Embodiment)

FIG. 9 is a schematic circuit configuration diagram of a half bridge circuit including a gate drive circuit $GC_1$ and a gate drive circuit $GC_4$, in the power supply 10 according to the embodiment.

As shown in FIG. 9, the power supply 10 according to the embodiment includes: a first switching device Q1 of which a first drain is connected to a positive-side power terminal P; a second switching device Q4 of which a second drain connected to an output terminal O is connected to a first source of a first switching device Q1, the second switching device Q4 of which a second source is connected to a negative-side power terminal N; a gate drive circuit ($GC_1$) $60_1$ connected to a first gate of the first switching device Q1, and a gate drive circuit ($GC_4$) $60_4$ connected to a second gate of the second switching device Q4; a first gate driver ($GD_1$) $50_1$ connected between the first gate and the first source of the first switching device Q1 through the gate drive circuit ($GC_1$) $60_1$, the first gate driver ($GD_1$) $50_1$ configured to drive the first gate switching device Q1; and A second gate driver ($GD_4$) $50_4$ connected between the second gate and the second source of the second switching device Q4 through the gate drive circuit ($GC_4$) $60_4$, the second gate driver ($GD_4$) $50_4$ configured to drive the second switching device Q4.

The gate driver ($GD_1$) $50_1$ includes a signal terminal GT1 for driving the switching device Q1, and the gate driver ($GD_4$) $50_4$ includes a signal terminal GT4 for driving the switching device Q4.

The power supply 10 further includes: a snubber diode D1 connected in reversely parallel between the first drain and the first source of the first gate switching device Q1; and a snubber diode D4 connected in reversely parallel between the second drain and the first source of the second switching device Q4.

In the embodiment, the first gate switching device Q1 and the second switching device Q4 are connected in series between the positive-side power terminal P and the negative-side power terminal N, and thereby forms a half-bridge type inverter circuit.

In addition, a detailed circuit configuration of the gate drive circuit ($GC_1$) $60_1$ and the gate drive circuit ($GC_4$) $60_4$ will be mentioned below with reference to FIGS. 16-27.

According to the embodiment, there can be provided the gate drive circuit having high speed switching performance in which the misoperation associated with the gate erroneous turning-on is suppressed and the surge voltage is reduced; and the power supply mounted with such a gate drive circuit.

(Simulation Result: Comparative Example)

Figure 10A:
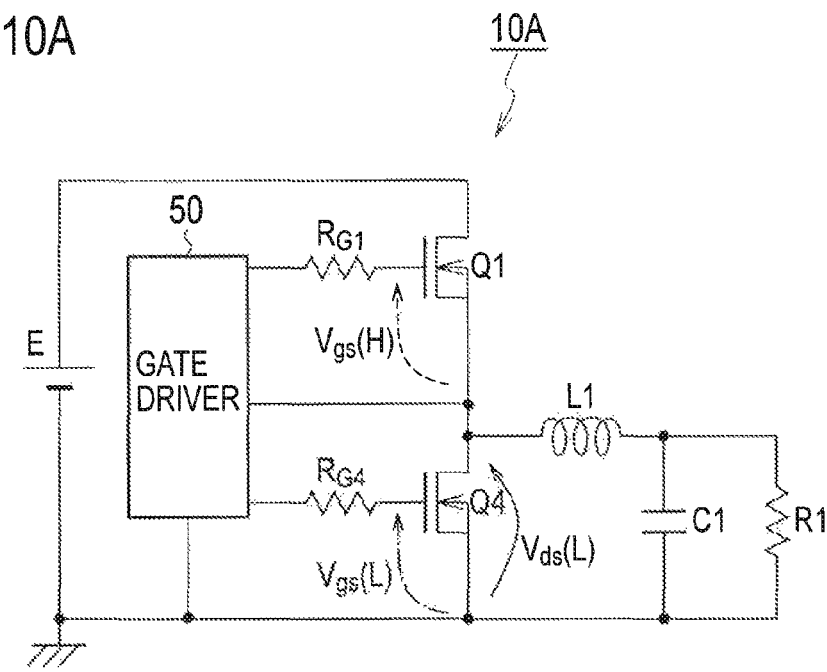
FIG. 10A is a schematic circuit configuration diagram of a half bridge circuit including a gate resistance $R_{G1}$ as the gate drive circuit $GC_1$ and a gate resistance $R_{G4}$ as the gate drive circuit $GC_4$, in a power supply according a comparative example.

FIG. 10A shows a schematic circuit configuration of a half-bridge type inverter including a gate resistance $R_{G1}$ as a gate drive circuit $60_1$ and a gate resistance $R_{G4}$ as a gate drive circuit $60_4$, in a power supply 10A according to a comparative example. As shown in FIG. 10A, a circuit including an inductance L1, a capacitance C1, and a resistance R1 is connected as load between the drain and the source of the second switching device Q4. The gate driver 50 is connected through the gate resistance $R_{G1}$ between the first gate and the first source of the first switching device Q1 and drives the first gate switching device Q1, and is connected through the gate resistance $R_{G4}$ between the second gate and the second source of the second switching device Q4 and drives the second switching device Q4.

Figure 10B:
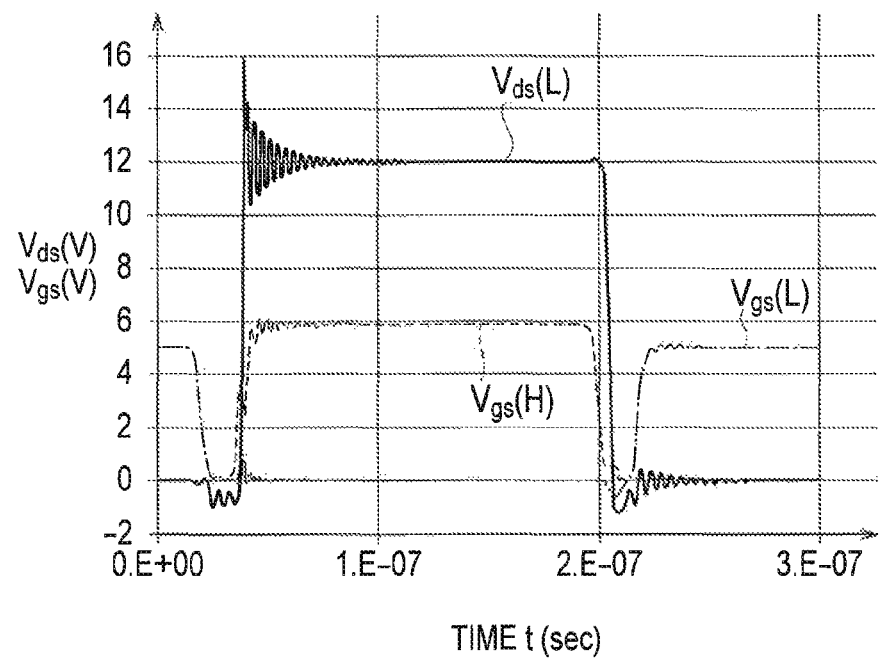
FIG. 10B shows a waveform example of the voltages Vgs(H), Vgs(L) between the gate and the source, and a waveform example of the voltage Vds(L) between the drain and the source, in the case of the gate resistance $R_{G1}=R_{G4}=1\Omega$, in FIG. 10A.
Figure 11:
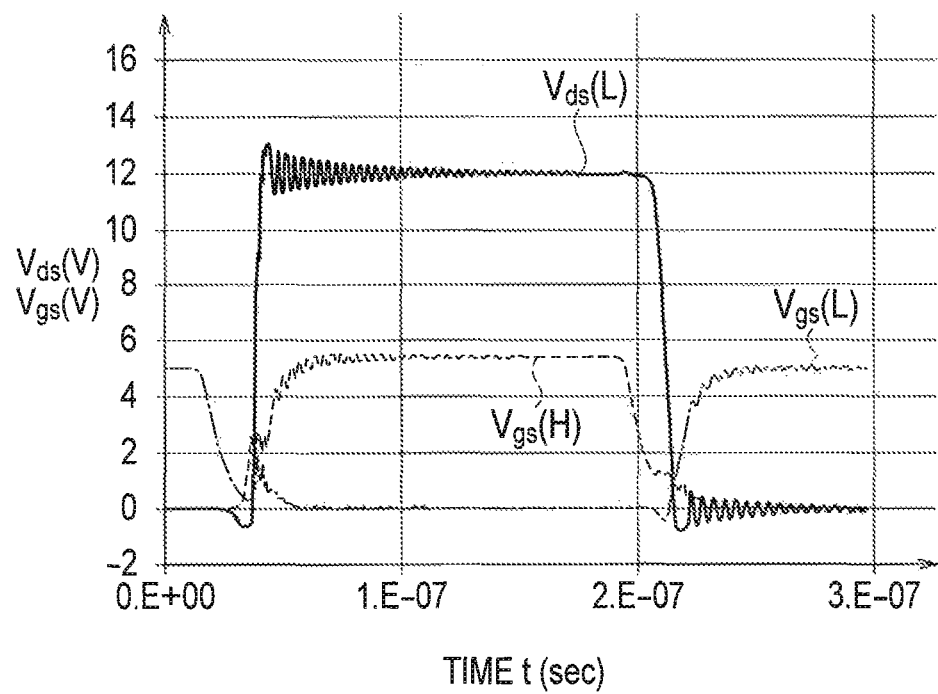
FIG. 11 shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$, in FIG. 10A.

FIG. 10B shows a waveform example of the voltages Vgs(H), Vgs(L) between the gate and the source, and a waveform example of the voltage Vds(L) between the drain and the source, in the case of the gate resistance $R_{G1}=R_{G4}=1\Omega$, in FIG. 10A. Moreover, FIG. 11 shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$, in FIG. 10A. In this case, Vgs(H) denotes the voltage between the gate and the source of the first gate switching device Q1, and Vgs(L) denotes the voltage between the gate and the source of the second switching device Q4. Vds(L) denotes the voltage between the drain and the source of the second switching device Q4.

In the case of the gate resistance $R_{G1}=R_{G4}=1\Omega$, as shown in FIG. 10B, it is proved that an oscillatory waveform is observed, in the rise of Vds(L), and it is easy to generate the drain surge voltage.

On the other hand, in the case of gate resistances $R_{G1}=R_{G4}=10\Omega$, as shown in FIG. 11, the oscillatory waveform of the drain surge voltage observed in the rise of Vds(L) is suppressed More specifically the value of the drain surge voltage can be decreased by increasing the value of gate resistances $R_{G1}=R_{G4}$. However, a voltage rise which is not intended is observed in Vgs(L) in the timing of the rise of Vds(L), and it is proved that it is easy to generate an erroneous turning-on associated with the rise of the voltage Vgs(L) between the gate and the source of the second switching device Q4.

(Simulation Result: Embodiment)

Figure 12A:
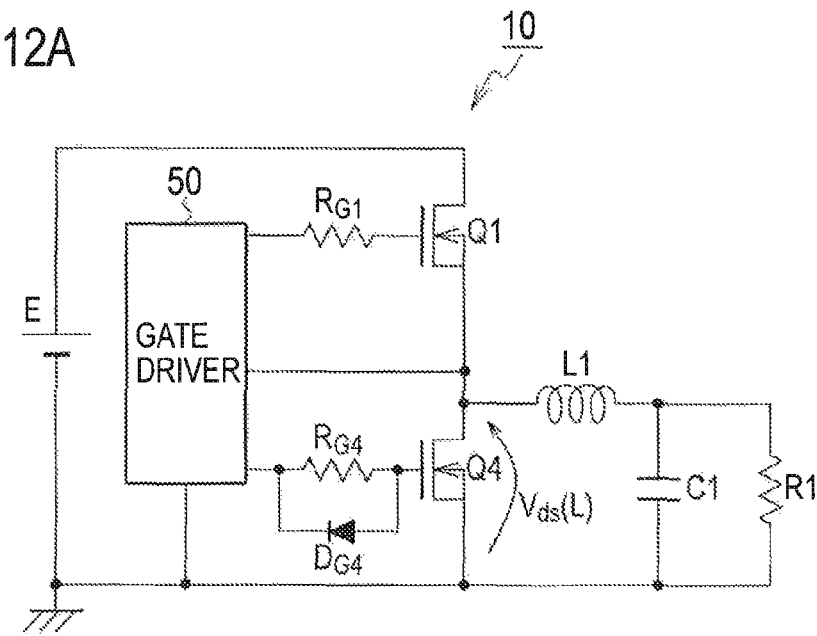
FIG. 12A is a schematic circuit configuration diagram of a half bridge circuit including a gate resistance $R_{G1}$ as the gate drive circuit $GC_1$ and a gate resistance $R_{G4}$ and a gated diode $D_{G4}$ as the gate drive circuit $GC_4$, in a power supply according the embodiment.

FIG. 12A shows a schematic circuit configuration of the half bridge circuit including the gate resistance $R_{G1}$ as the gate drive circuit $60_1$, and the gate resistance $R_{G4}$ and a gated diode $D_{G4}$ as the gate drive circuit $60_4$, in the power supply 10 according the embodiment. As shown in FIG. 12A, a circuit including an inductance L1, a capacitance C1, and a resistance R1 is connected as load between the drain and the source of the second switching device Q4. The gate driver 50 is connected through the gate resistance $R_{G1}$ between the first gate and the first source of the first switching device Q1 and drives the first gate switching device Q1, and is connected through the gate resistance $R_{G4}$ and the gated diode $D_{G4}$ between the second gate and the second source of the second switching device Q4 and drives the second switching device Q4.

Figure 12B:
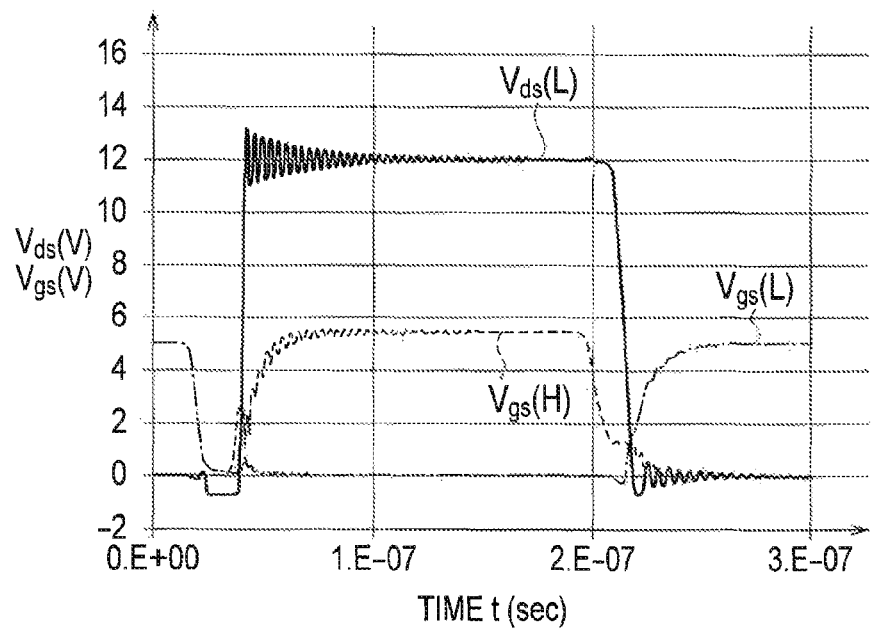
FIG. 12B shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$, in FIG. 12A.

FIG. 12B shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$, in FIG. 12A. Moreover, FIG. 13 shows a waveform example of the voltages Vgs(H), Vgs(L) between the gate and the source, and waveform examples of the voltage Vds(L) between the drain and the source, and the drain current Id(L), in the case of the gate resistance $R_{G1}=R_{G4}=10\Omega$, in FIG. 12A.

Figure 13:
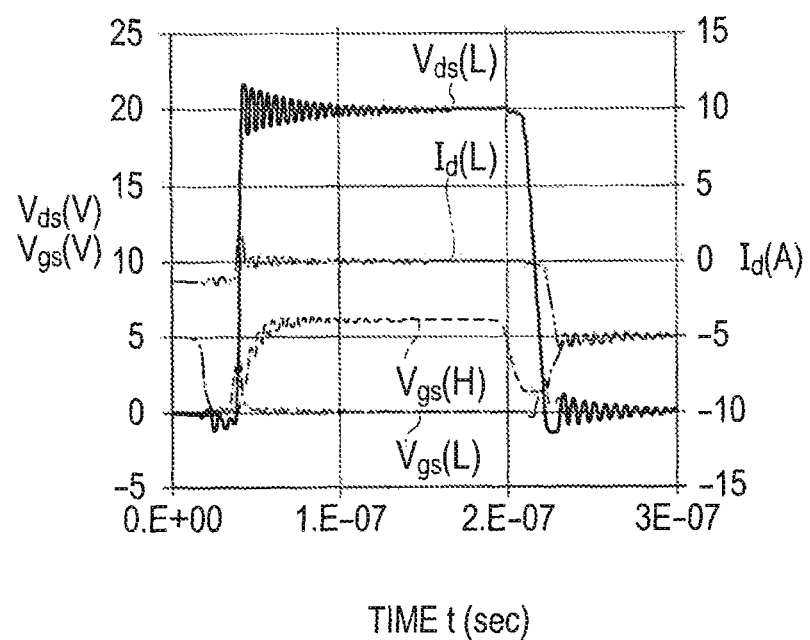
FIG. 13 shows a waveform example of the voltages Vgs(H), Vgs(L) between the gate and the source, and waveform examples of the voltage Vds(L) between the drain and the source, and the drain current Id(L), in the case of the gate resistance $R_{G1}=R_{G4}=10\Omega$, in FIG. 12A.

On the other hand, in the case of gate resistances $R_{G1}=R_{G4}=10\Omega$ and using the gated diode $D_{G4}$, as shown in FIGS. 12B and 13, the oscillatory waveform of the drain surge voltage observed in the rise of Vds(L) is suppressed. More specifically the value of the drain surge voltage can be decreased by increasing the value of gate resistances $R_{G1}=R_{G4}$. Furthermore, no unintended voltage rise is observed in Vgs(L) In the timing of the rise of Vds(L), and no erroneous turning-on is generated. On the other hand, a delayed waveform is observed in Vgs(L), Vds(L) in the timing of the falling of Vds(L).

Figure 14A:
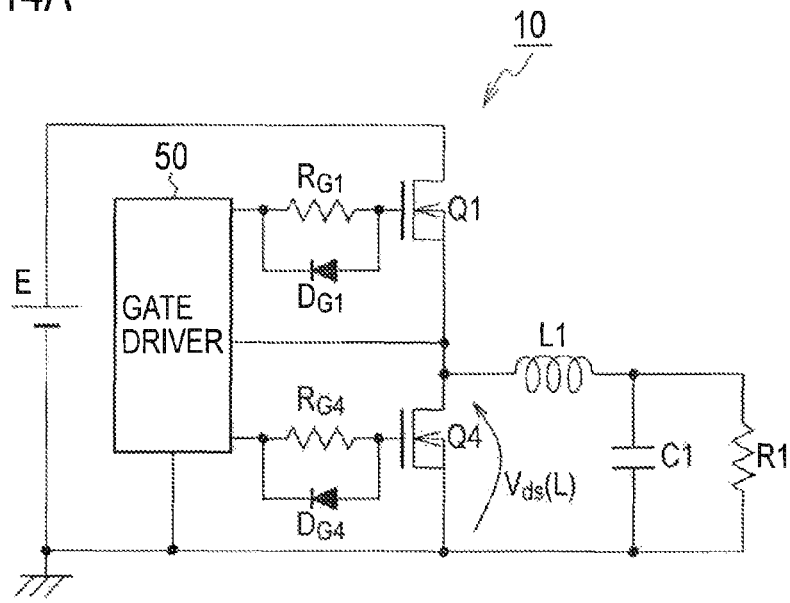
FIG. 14A is a schematic circuit configuration diagram of a half bridge circuit including a gate resistance $R_{G1}$ and a gated diode $D_{G1}$ as the gate drive circuit $GC_1$, and a gate resistance $R_{G4}$ and a gated diode $D_{G4}$ as the gate drive circuit $GC_4$, in a power supply according the embodiment.

FIG. 14A shows a schematic circuit configuration of the half bridge circuit including the gate resistance $R_{G1}$ and the gated diode $D_{G1}$ as the gate drive circuit $60_1$, and the gate resistance $R_{G4}$ and the gated diode $D_{G4}$ as the gate drive circuit $60_4$, in the power supply 10 according the embodiment. As shown in FIG. 14A, a circuit including an inductance L1, a capacitance C1, and a resistance R1 is connected as load between the drain and the source of the second switching device Q4. The gate driver 50 is connected through the gate resistance $R_{G1}$ between the first gate and the first source of the first switching device Q1 and drives the first gate switching device Q1, and is connected through the gate resistance $R_{G4}$ and the gated diode $D_{G4}$ between the second gate and the second source of the second switching device Q4 and drives the second switching device Q4.

Figure 14B:
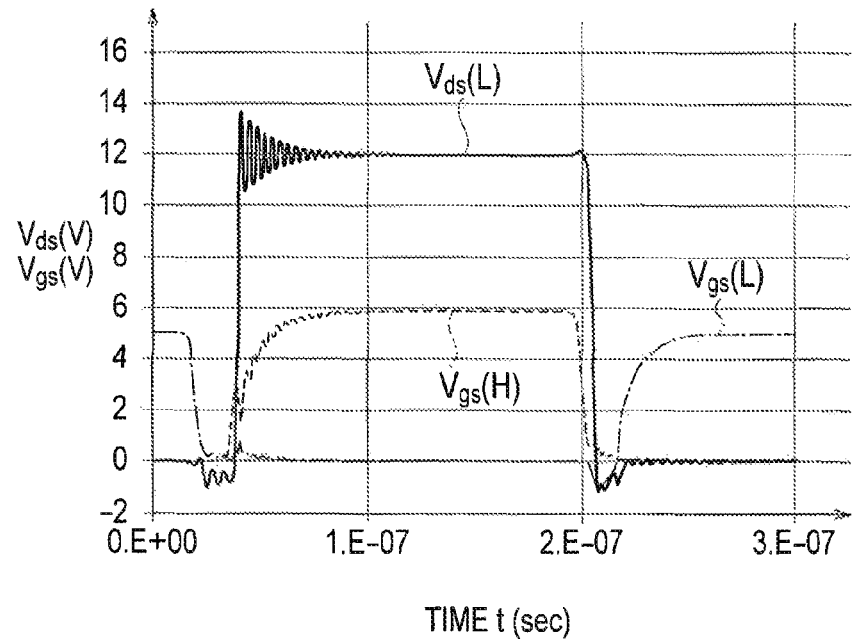
FIG. 14B shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$, in FIG. 14A.

FIG. 14B shows a waveform example of the voltages Vgs(H), Vgs(L) between the gate and the source, and a waveform example of the voltage Vds(L) between the drain and the source, in the case of the gate resistance $R_{G1}=R_{G4}=10\Omega$ and using the gated diodes $D_{G1}$, $D_{G4}$, in FIG. 14A. On the other hand, in the case of gate resistances $R_{G1}=R_{G4}=10\Omega$ and using the gated diodes $D_{G1}$, $D_{G4}$, as shown in FIG. 14B, the oscillatory waveform of the drain surge voltage in the rise of Vds(L) is suppressed. More specifically the value of the drain surge voltage can be decreased by increasing the value of gate resistances $R_{G1}=R_{G4}$. Furthermore, no unintended voltage rise is observed in Vgs(L) In the timing of the rise of Vds(L), and no erroneous turning-on is generated. Furthermore, no delayed waveform is also observed in Vgs(L), Vds(L) in the timing of the falling of Vds(L).

(Effect in Half Bridge Circuit)

Figure 15:
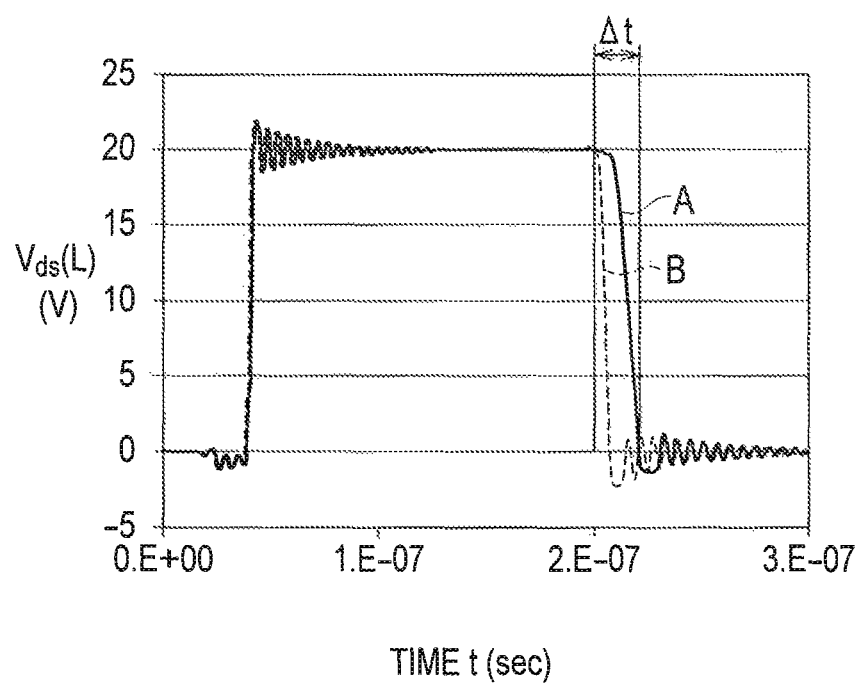
FIG. 15 is a waveform example of the voltage Vds(L) between the drain and the source, in a comparison between the example of FIG. 12B and the example of FIG. 14B.

FIG. 15 shows a waveform example of the voltage Vds(L) between the drain and the source, in a comparison between FIGS. 12B and 14B. In FIG. 15, the curved line A corresponds to the example of which the gated diode $D_{G4}$ is applied only to the low side (second switching device Q4 side), as shown in FIG. 12A, and the curved line B corresponds to the example of which the gated diodes $D_{G1}$, $D_{G4}$ are applied to both of the high side (first switching device Q1 side) and the low side (second switching device Q4 side), as shown in FIG. 14A.

The illustrated time period Δt is a time period when the first gate switching device Q1 is shifted from ON state to OFF state, and the second switching device Q4 is in OFF state. During the time period, since the main power supply voltage E currently supplied to Vds(L) is cut off, Vds(L) begins to fall from E. At this time, the turn-off of the first gate switching device Q1 is more accelerated and therefore the switching speed is more improved in the case of the curved line B where the gate drive circuit according to the embodiment is added also to the high side (first switching device Q1 side), as compared with the case of the curved line A where the gate drive circuit is applied only to the low side (second switching device Q4 side).

If the gate drive circuit according to the embodiment is applied, the falling speed of Vds(L) at the time of switching from ON to OFF is maintainable, while limiting the rising speed of Vds(L) at the time of switching from OFF to ON.

The erroneous turning-on associated with the rise of Vds(L) can be prevented by applying the gate drive circuit according to the embodiment only to the low side (second switching device Q4 side). However, since it has an effect that the falling speed of Vds(L) at the time of switching from ON to OFF is maintainable while limiting the rising speed of Vds(L) at the time of switching OFF to ON, the gate drive circuit according to the embodiment may be applied to both of or any one of the low side and the high side if expecting such an effect.

Figure 16:
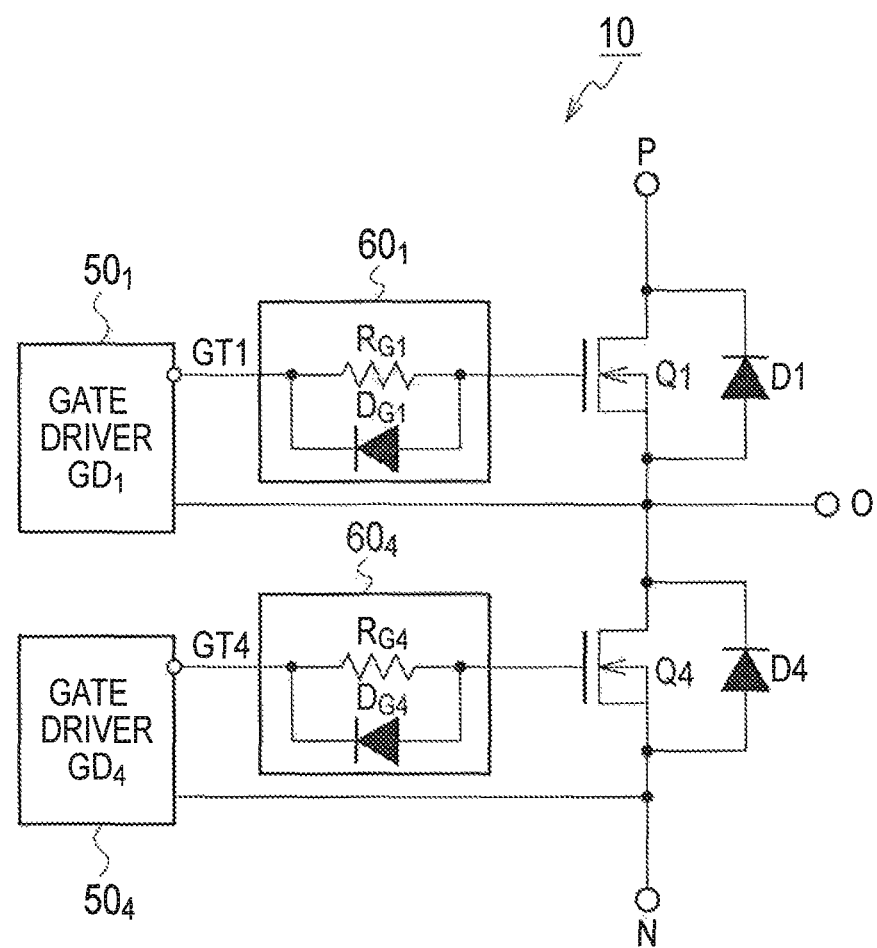
FIG. 16 is a schematic circuit configuration diagram of a half bridge circuit including a gate resistance $R_{G1}$ and a gated diode $D_{G1}$ as the gate drive circuit $GC_1$, and a gate resistance $R_{G4}$ and a gated diode $D_{G4}$ as the gate drive circuit $GC_4$, in a power supply according the embodiment.

FIG. 16 shows a schematic circuit configuration of the half bridge circuit including the gate resistance $R_{G1}$ and the gated diode $D_{G1}$ as the gate drive circuit $60_1$, and the gate resistance $R_{G4}$ and the gated diode $D_{G4}$ as the gate drive circuit $60_4$, in the power supply 10 according the embodiment.

As shown in FIG. 16, the power supply 10 according to the embodiment includes: a first switching device Q1 of which a first drain is connected to a positive-side power terminal P; a second switching device Q4 of which a second drain connected to an output terminal O is connected to a first source of a first switching device Q1, the second switching device Q4 of which a second source is connected to a negative-side power terminal N; a gate drive circuit $60_1$ connected to a first gate of the first switching device Q1, and a gate drive circuit $60_4$ connected to a second gate of the second switching device Q4; a first gate driver (GD$_1$) $50_1$ connected between the first gate and the first source of the first switching device Q1 through the gate drive circuit $60_1$, the first gate driver (GD$_1$) $50_1$ configured to drive the first gate switching device Q1; and a second gate driver (GD$_4$) $50_4$ connected between the second gate and the second source of the second switching device Q4 through the gate drive circuit $60_4$, the second gate driver (GD$_4$) $50_4$ configured to drive the second switching device Q4.

The gate driver (GD$_1$) $50_1$ includes a signal terminal GT1 for driving the switching device Q1, and the gate driver (GD$_4$) $50_4$ includes a signal terminal GT4 for driving the switching device Q4. The same applies hereafter.

In the embodiment, the gate drive circuit $60_1$ includes: a gate resistance $R_{G1}$ connected to the gate of the switching device Q1; and a gated diode $D_{G1}$ connected in parallel to the gate resistance $R_{G1}$, wherein a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device.

Moreover, a relationship of $R_{on}<R_G$ is satisfied, where $R_{on}$ is a value of on-resistance of the switching device Q1, and $R_G$ is a value of the gate resistance $R_{G1}$. The gate drive circuit $60_4$ is also the same thereas. Moreover, as shown in FIG. 16, the anodes of the gated diodes $D_{G1}$, $D_{G4}$ are respectively connected to the gates of the switching devices Q1, Q4, and the cathodes thereof are respectively connected to the gate drivers (GD$_1$) $50_1$, (GD$_4$) $50_4$.

The power supply 10 further includes: a snubber diode D1 connected in reversely parallel between the first drain and the first source of the first gate switching device Q1; and a snubber diode D4 connected in reversely parallel between the second drain and the first source of the second switching device Q4.

More particularly, the power supply 10 according the embodiment includes: a first switching device Q1 configured to control an ON/OFF state; a gate driver (GD$_1$) $50_1$ configured to drive the first gate switching device Q1 by applying voltage to a gate of the first switching device Q1; a gate resistance $R_{G1}$ disposed between the gate of the first switching device Q1 and the gate driver (GD$_1$) $50_1$; and a gated diode $D_{G1}$ connected between the gate and the gate driver (GD$_1$) $50_1$ in parallel to the gate resistance $R_{G1}$ so that an anode is at a gate side of the first switching device Q1 and a cathode is at a gate driver (GD$_1$) $50_1$ side, wherein a relationship between a threshold voltage $V_{th}(Di)$ of the gated diode $D_{G1}$ and a threshold voltage $V_{th}(Tr)$ of the first switching device Q1 satisfy $V_{th}(Di)<V_{th}(Tr)$.

Moreover, a relationship of $R_G=Rgi+Rge$ is satisfied where $R_G$ is a value of gate resistance $R_{G1}$, Rgi is a value of internal resistance in the gate itself of the switching device Q1, and Rge is a value of external resistance to be added.

Moreover, a relationship of $R_{on}<R_G$ is satisfied, where $R_{on}$ is a value of on-resistance of the switching device Q1, and $R_G$ is a value of the gate resistance $R_{G1}$.

According to the embodiment, there can be provided the gate drive circuit having high speed switching performance in which the misoperation associated with the gate erroneous turning-on is suppressed and the surge voltage is reduced; and the power supply mounted with such a gate drive circuit.

Figure 17:
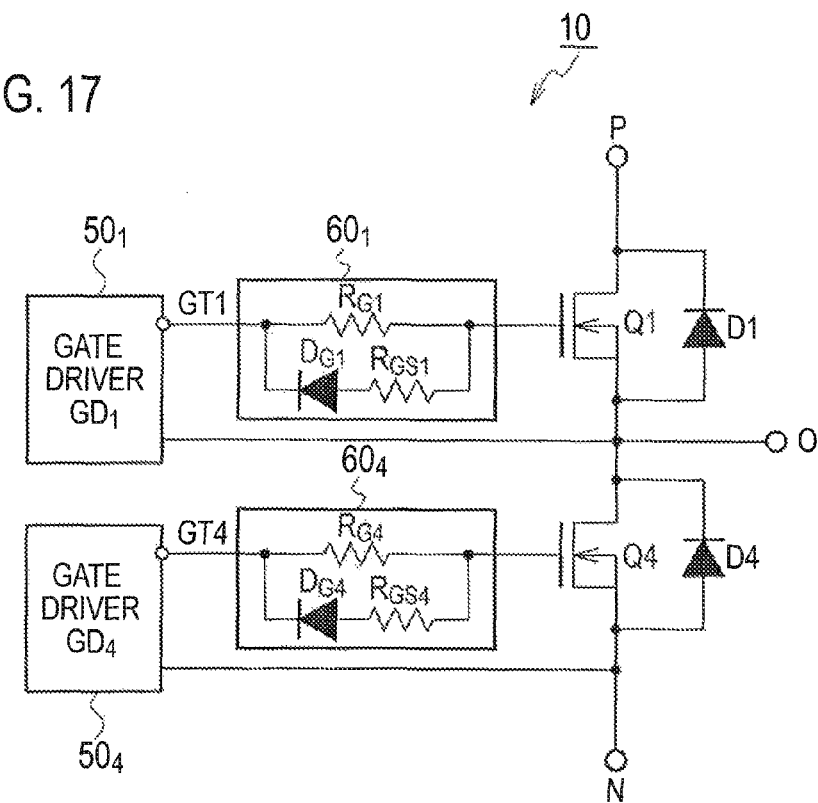
FIG. 17 is a schematic circuit configuration diagram of a half bridge circuit including gate resistance $R_{G1}$, a gated diode $D_{G1}$, and series resistance $R_{GS1}$ as the gate drive circuit $GC_1$, and a gate resistance $R_{G4}$, a gated diode $D_{G4}$, and a series resistance $R_{GS4}$ as the gate drive circuit $GC_4$, in a power supply according the embodiment.

FIG. 17 shows a schematic circuit configuration of the half bridge circuit including the gate resistance $R_{G1}$, the gated diode $D_{G1}$, and the series resistance $R_{GS1}$ as the gate drive circuit $60_1$, and the gate resistance $R_{G4}$, the gated diode $D_{G4}$, and the series resistance $R_{GS4}$ as the gate drive circuit $60_4$, in the power supply 10 according the embodiment.

As shown in FIG. 17, the gate drive circuit $60_1$ in the power supply 10 according the embodiment includes a first series resistance $R_{GS1}$ connected in series to the gated diode $D_{G1}$, wherein a series circuit including the gated diode $D_{G1}$ and the series resistance $R_{GS1}$ is connected in parallel to the gate resistance $R_{G1}$. Similarly, the gate drive circuit $60_4$ includes a second series resistance $R_{GS4}$ connected in series to the gated diode $D_{G4}$, wherein a series circuit including the gated diode $D_{G4}$ and the series resistance $R_{GS4}$ is connected in parallel to the gate resistance $R_{G4}$.

Figure 18:
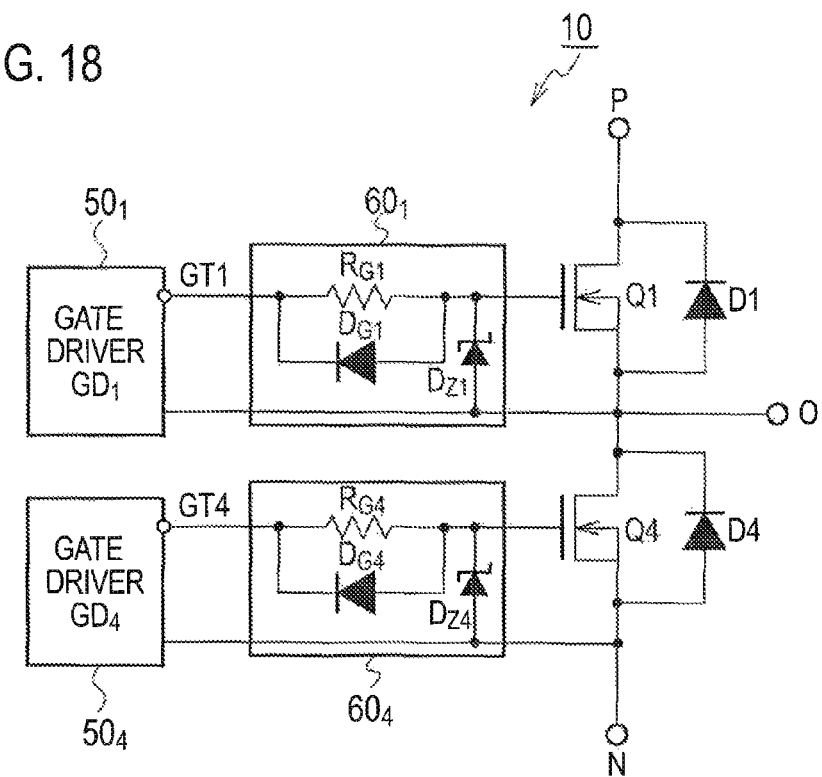
FIG. 18 is a schematic circuit configuration diagram of a half bridge circuit including a gate resistance $R_{G1}$, a gated diode $D_{G1}$, and a Zener diode $D_{Z1}$ as the gate drive circuit $GC_1$, and a gate resistance $R_{G4}$, a gated diode $D_{G4}$, and a Zener diode $D_{Z4}$ as the gate drive circuit $GC_4$, in a power supply according the embodiment.

FIG. 18 shows a schematic circuit configuration of the half bridge circuit including the gate resistance $R_{G1}$, the gated diode $D_{G1}$, and the Zener diode $D_{Z1}$ as the gate drive circuit $60_1$, and the gate resistance $R_{G4}$, the gated diode $D_{G4}$, and the Zener diode $D_{Z4}$ as the gate drive circuit $60_4$, in the power supply 10 according the embodiment.

As shown in FIG. 18, the gate drive circuit $60_1$ in the power supply 10 according the embodiment includes a voltage limiting Zener diode $D_{Z1}$ connected in parallel between the gate and the source of the first gate switching device Q1. Similarly, the gate drive circuit $60_4$ includes a voltage limiting Zener diode $D_{Z4}$ connected in parallel between the gate and the source of the second switching device Q4.

In the embodiment, the voltage limiting Zener diode $D_{Z1}$ is disposed closer to the gate side of the first switching device Q1 than the gated diode $D_{G1}$ and the gate resistance $R_{G1}$. Similarly, the voltage limiting Zener diode $D_{Z4}$ is disposed closer to the gate side of the second switching device Q4 than the gated diode $D_{G4}$ and the gate resistance $R_{G4}$.

Figure 19:
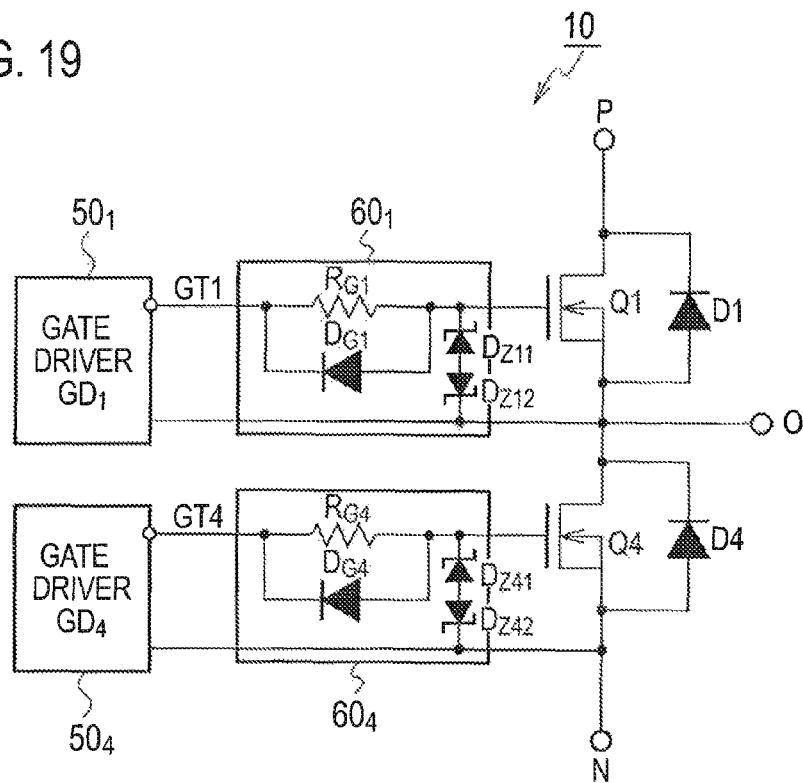
FIG. 19 is a schematic circuit configuration diagram of a half bridge circuit including a gate resistance $R_{G1}$, a gated diode $D_{G1}$, and Zener diodes $D_{Z11}$, $D_{Z12}$ as the gate drive circuit $GC_1$, and a gate resistance $R_{G4}$, a gated diode $D_{G4}$, and Zener diodes $D_{Z41}$, $D_{Z42}$ as the gate drive circuit $GC_4$, in a power supply according the embodiment.

FIG. 19 shows a schematic circuit configuration of the half bridge circuit including the gate resistance $R_{G1}$, the gated diode $D_{G1}$, and the Zener diodes $D_{Z11}$, $D_{Z12}$ as the gate drive circuit $GC_1$, and the gate resistance $R_{G4}$, the gated diode $D_{G4}$, and the Zener diodes $D_{Z41}$, $D_{Z42}$ as the gate drive circuit $GC_4$, in the power supply 10 according the embodiment.

As shown in FIG. 19, the gate drive circuit $60_1$ in the power supply 10 according the embodiment includes the voltage limiting Zener diodes $D_{Z11}$, $D_{Z12}$ of serial structure connected in parallel between the gate and the source of the first gate switching device Q1. Similarly, the gate drive circuit $60_4$ includes the voltage limiting Zener diodes $D_{Z41}$, $D_{Z42}$ of serial structure connected in parallel between the gate and the source of the second switching device Q4.

In the embodiment, the voltage limiting Zener diodes $D_{Z11}$, $D_{Z12}$ are disposed closer to the gate side of the first switching device Q1 than the gated diode $D_{G1}$ and the gate resistance $R_{G1}$. Similarly, the voltage limiting Zener diodes $D_{Z41}$, $D_{Z42}$ are disposed closer to the gate side of the second switching device Q4 than the gated diode $D_{G4}$ and the gate resistance $R_{G4}$.

Figure 20:
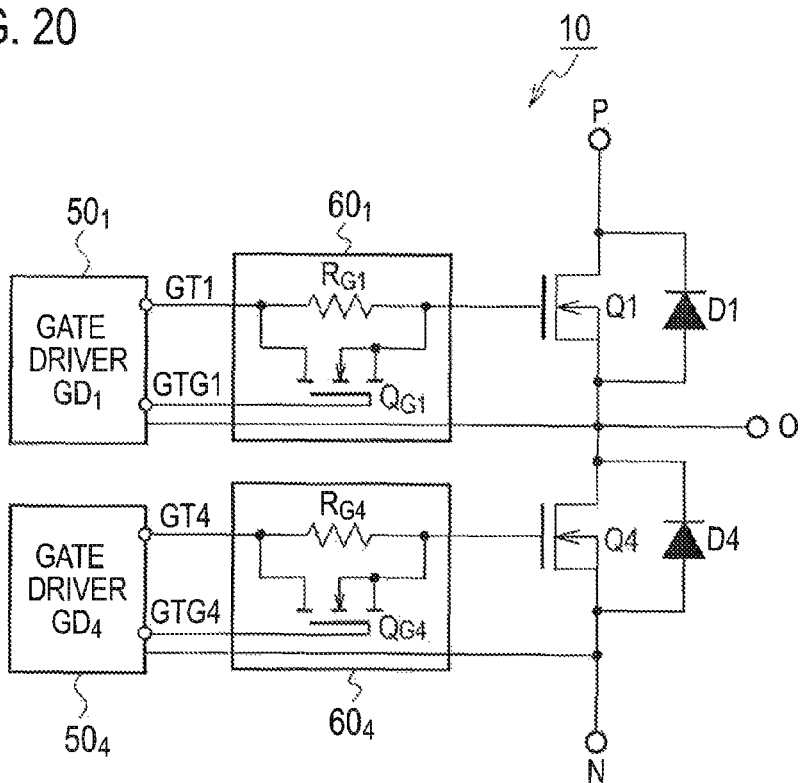
FIG. 20 is a schematic circuit configuration diagram of a half bridge circuit including a gate resistance $R_{G1}$ and a gate switching device $Q_{G1}$ as the gate drive circuit $GC_1$, and a gate resistance $R_{G4}$ and a gate switching device $Q_{G4}$ as the gate drive circuit $GC_4$, in a power supply according the embodiment.

FIG. 20 shows a schematic circuit configuration of the half bridge circuit including the gate resistance $R_{G1}$ and the first gate switching device $Q_{G1}$ as the gate drive circuit $60_1$, and the gate resistance $R_{G4}$ and the second gate switching device $Q_{G4}$ as the gate drive circuit $60_4$, in the power supply 10 according the embodiment.

As shown in FIG. 20, the power supply 10 according to the embodiment includes: a first switching device Q1 of which a first drain is connected to a positive-side power terminal P; a second switching device Q4 of which a second drain connected to an output terminal O is connected to a first source of a first switching device Q1, the second switching device Q4 of which a second source is connected to a negative-side power terminal N; a gate drive circuit $60_1$ connected to a first gate of the first switching device Q1, and a gate drive circuit $60_4$ connected to a second gate of the second switching device Q4; a first gate driver $50_1$ connected between the first gate and the first source of the first switching device Q1 through the gate drive circuit $60_1$, the first gate driver $50_1$ configured to drive the first gate switching device Q1; and a second gate driver $50_4$ connected between the second gate and the second source of the second switching device Q4 through the gate drive circuit $60_4$, the second gate driver $50_4$ configured to drive the second switching device Q4.

The power supply 10 further includes: a snubber diode D1 connected in reversely parallel between the first drain and the first source of the first gate switching device Q1; and a snubber diode D4 connected in reversely parallel between the second drain and the first source of the second switching device Q4.

In the embodiment, the first gate switching device Q1 and the second switching device Q4 are connected in series between the positive-side power terminal P and the negative-side power terminal N, and thereby forms a half-bridge type inverter.

More particularly, as shown in FIG. 20, the power supply 10 according the embodiment includes: a switching device Q1 configured to control an ON/OFF state; a gate driver $(GD_1)$ $50_1$ configured to drive the gate switching device Q1 by applying voltage to a gate of the switching device Q1; a gate resistance $R_{G1}$ disposed between the gate of the switching device Q1 and the gate driver $(GD_1)$ $50_1$; and a gate switching diode $D_{G1}$ connected between the gate of the first switching device Q1 and the gate driver $(GD_1)$ $50_1$ in parallel to the gate resistance $R_{G1}$ so that a source is at a gate side of the first switching device Q1 and a drain is at a gate driver $(GD_1)$ $50_1$ side, wherein a relationship between a threshold voltage $V_{th}(TrG)$ of the gate switching device $Q_{G1}$ and a threshold voltage $V_{th}(Tr)$ of the first switching device Q1 satisfy $V_{th}(TrG)<V_{th}(Tr)$. The gate drive circuit $60_4$ is also the same thereas.

In the gate drive circuit $60_1$ of the power supply 10 according the embodiment, as shown in FIG. 20, the source of the first gate switching device $Q_{G1}$ is short-circuited to the gate of the first gate switching device Q1.

Similarly, as shown in FIG. 20, the gate drive circuit $60_4$ of the power supply 10 according the embodiment includes a second gate switching device $Q_{G4}$ connected in parallel to the gate resistance $R_{G4}$, and the source of the second gate switching device $Q_{G4}$ is short-circuited to the gate of the second switching device Q4.

Moreover, a relationship of $R_{on}<R_G$ is satisfied, where $R_{on}$ is a value of the on-resistance of the switching device Q1, and $R_G$ is a resistance value of the gate resistance $R_{G1}$.

Furthermore, as shown in FIG. 20, the first gate driver $50_1$ includes a signal terminal GTG1 for driving the first gate switching device $Q_{G1}$, and the signal terminal GTG1 is connected to the gate of the first gate switching device $Q_{G1}$. Similarly, the second gate driver $50_4$ includes a signal terminal GTG4 for driving the second gate switching device $Q_{G4}$, and the signal terminal GTG4 is connected to the gate of the second gate switching device $Q_{G4}$. The same applies hereafter.

Moreover, the first gate switching device $Q_{G1}$ is switched in accordance with ON/OFF operation by the first gate switching device Q1, and the second gate switching device $Q_{G4}$ is also switched in accordance with ON/OFF operation by the second switching device Q4.

Figure 21:
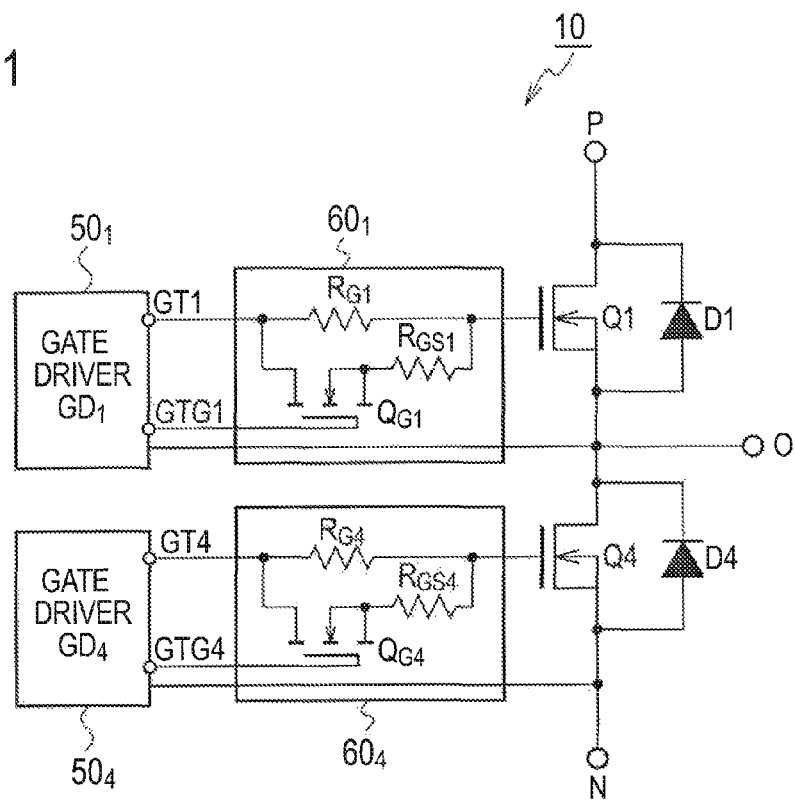
FIG. 21 is a schematic circuit configuration diagram of a half bridge circuit including a gate resistance $R_{G1}$, a gate switching device $Q_{G1}$, and a series resistance $R_{GS1}$ as the gate drive circuit $GC_1$, and a gate resistance $R_{G4}$, a gate switching device $Q_{G4}$, and a series resistance $R_{GS4}$ as the gate drive circuit $GC_4$, in a power supply according the embodiment.

FIG. 21 shows a schematic circuit configuration of the half bridge circuit including the gate resistance $R_{G1}$, the first gate switching device $Q_{G1}$, and the series resistance $R_{GS1}$ as the gate drive circuit $60_1$, and the gate resistance $R_{G4}$, the second gate switching device $Q_{G4}$, and series resistance $R_{GS4}$ as the gate drive circuit $60_4$, in the power supply 10 according the embodiment.

As shown in FIG. 21, the gate drive circuit $60_1$ in the power supply 10 according the embodiment includes first series resistance $R_{GS1}$ connected in series to the first gate switching device $Q_{G1}$, wherein a series circuit including the first gate switching device $Q_{G1}$ and the series resistance $R_{GS1}$ is connected in parallel to the gate resistance $R_{G1}$. Similarly, the gate drive circuit $60_4$ includes a second series resistance $R_{GS4}$ connected in series to the second gate switching device $Q_{G4}$, wherein a series circuit including the second gate switching device $Q_{G4}$ and the series resistance $R_{GS4}$ is connected in parallel to the gate resistance $R_{G4}$. Other configurations of FIG. 21 are the same as those of FIG. 20.

Figure 22:
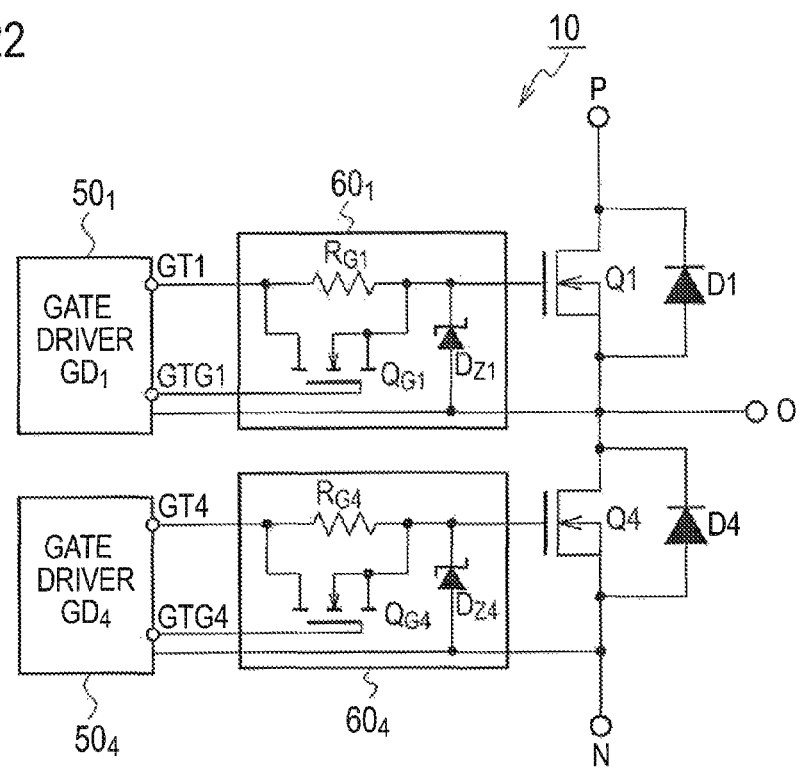
FIG. 22 is a schematic circuit configuration diagram of a half bridge circuit including a gate resistance $R_{G1}$, a gate switching device $Q_{G1}$, and a Zener diode $D_{Z1}$ as the gate drive circuit $GC_1$, and a gate resistance $R_{G4}$, a gate switching device $Q_{G4}$, and a Zener diode $D_{Z4}$ as the gate drive circuit $GC_4$, in a power supply according the embodiment.

FIG. 22 shows a schematic circuit configuration of the half bridge circuit including the gate resistance $R_{G1}$, the first gate switching device $Q_{G1}$, and the Zener diode $D_{Z1}$ as the gate drive circuit $60_1$, and the gate resistance $R_{G4}$, the second gate switching device $Q_{G4}$, and Zener diode $D_{Z4}$ as the gate drive circuit $60_4$, in the power supply 10 according the embodiment.

As shown in FIG. 22, the gate drive circuit $60_1$ in the power supply 10 according the embodiment includes a voltage limiting Zener diode $D_{Z1}$ connected in parallel between the gate and the source of the first gate switching device Q1. Similarly, the gate drive circuit $60_4$ includes a voltage limiting Zener diode $D_{Z4}$ connected in parallel between the gate and the source of the second switching device Q4.

In the embodiment, the voltage limiting Zener diode $D_{Z1}$ is disposed closer to the gate side of the first switching device Q1 than the first gate switching device $Q_{G1}$ and the gate resistance $R_{G1}$. Similarly, the voltage limiting Zener diode $D_{Z4}$ is disposed closer to the gate side of the second switching device Q4 than the second gate switching device $Q_{G4}$ and the gate resistance $R_{G4}$. Other configurations of FIG. 22 are the same as those of FIG. 20.

Figure 23:
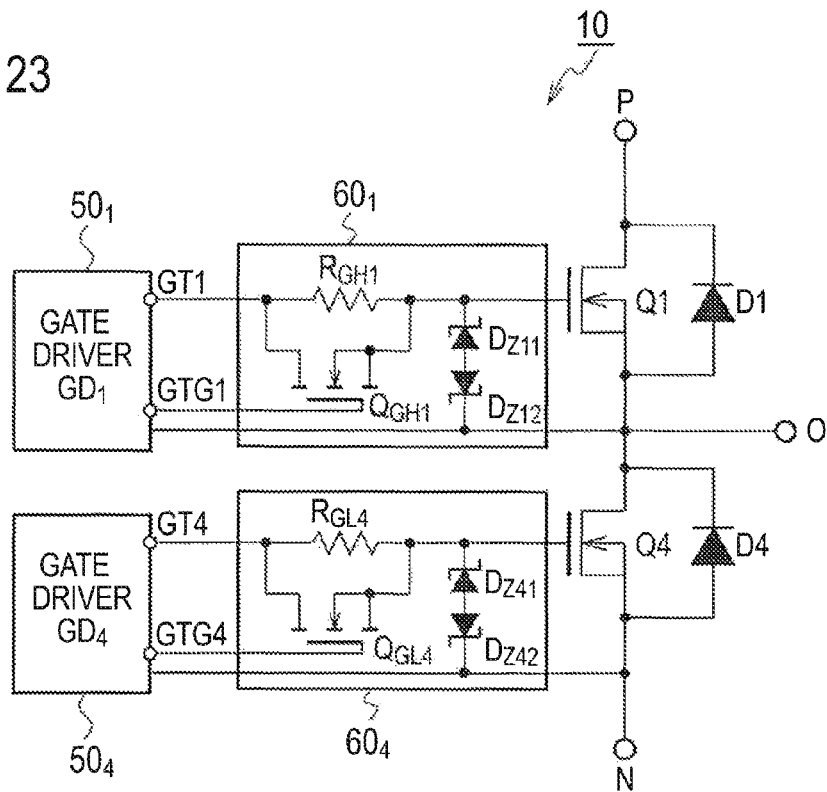
FIG. 23 is a schematic circuit configuration diagram of a half bridge circuit including a gate resistance $R_{G1}$, a gate switching device $Q_{G1}$, and Zener diodes $D_{Z11}$, $D_{Z12}$ as the gate drive circuit $GC_1$, and a gate resistance $R_{G4}$, a gate switching device $Q_{G4}$, and Zener diodes $D_{Z41}$, $D_{Z42}$ as the gate drive circuit $GC_4$, in a power supply according the embodiment.

FIG. 23 shows a schematic circuit configuration of the half bridge circuit including the gate resistance $R_{G1}$, the first gate switching device $Q_{G1}$, and the Zener diodes $D_{Z11}$, $D_{Z12}$ as the gate drive circuit $60_1$, and the gate resistance $R_{G4}$, the second gate switching device $Q_{G4}$, and Zener diodes $D_{Z41}$, $D_{Z42}$ as the gate drive circuit $60_4$, in the power supply 10 according the embodiment.

As shown in FIG. 23, the gate drive circuit $60_1$ in the power supply 10 according the embodiment includes the voltage limiting Zener diodes $D_{Z11}$, $D_{Z12}$ of serial structure connected in parallel between the gate and the source of the first gate switching device Q1. Similarly, the gate drive circuit $60_4$ includes the voltage limiting Zener diodes $D_{Z41}$, $D_{Z42}$ of serial structure connected in parallel between the gate and the source of the second switching device Q4.

In the embodiment, the voltage limiting Zener diodes $D_{Z11}$, $D_{Z12}$ are disposed closer to the gate side of the first switching device Q1 than the first gate switching device $Q_{G1}$, the gated diode $D_{G1}$, and the gate resistance $R_{G1}$. Similarly, the voltage limiting Zener diode $D_{Z4}$ is disposed closer to the gate side of the second switching device Q4 than the second gate switching device $Q_{G4}$ and the gate resistance $R_{G4}$. Other configurations of FIG. 23 are the same as those of FIG. 20.

Figure 24:
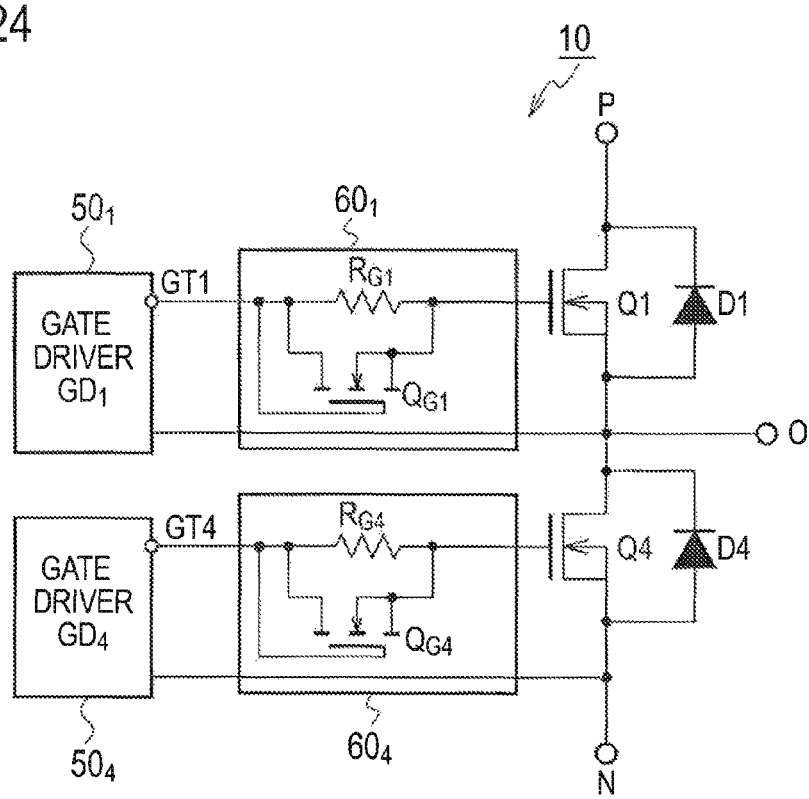
FIG. 24 is a schematic circuit configuration diagram of a half bridge circuit including a gate resistance $R_{G1}$ and a gate switching device $Q_{G1}$ as the gate drive circuit $GC_1$, and a gate resistance $R_{G4}$ and a gate switching device $Q_{G4}$ as the gate drive circuit $GC_4$, in a power supply according the embodiment.

FIG. 24 shows a schematic circuit configuration of the half bridge circuit including the gate resistance $R_{G1}$ and the first gate switching device $Q_{G1}$ as the gate drive circuit $60_1$, and the gate resistance $R_{G4}$ and the second gate switching device $Q_{G4}$ as the gate drive circuit $60_4$, in the power supply 10 according the embodiment.

As shown in FIG. 24, the gate drive circuit $60_1$ of the power supply 10 according the embodiment includes a first gate switching device $Q_{G1}$ connected in parallel to the gate resistance $R_{G1}$, and the drain of the first gate switching device $Q_{G1}$ is short-circuited to the gate of the first gate switching device Q1.

Similarly, as shown in FIG. 24, the gate drive circuit $60_4$ of the power supply 10 according the embodiment includes a second gate switching device $Q_{G4}$ connected in parallel to the gate resistance $R_{G4}$, and the drain of the second gate switching device $Q_{G4}$ is short-circuited to the gate of the second switching device Q4

Furthermore, in the first gate driver (GD$_1$) $50_1$, the signal terminal GTG1 for driving the first gate switching device $Q_{G1}$ is communalized with the signal terminal GT1 for driving the switching device Q1, and therefore the signal terminal GT1 is connected to the gate of the first gate switching device $Q_{G1}$. Similarly, in the second gate driver (GD$_4$) $50_4$, the signal terminal GTG1 for driving the second gate switching device $Q_{G2}$ is communalized with the signal terminal GT4 for driving the switching device Q1, and therefore the signal terminal GT1 is connected to the gate of the second gate switching device $Q_{G4}$.

Moreover, the first gate switching device $Q_{G1}$ is switched in accordance with ON/OFF operation by the first gate switching device Q1, and the second gate switching device $Q_{G4}$ is also switched in accordance with ON/OFF operation by the second switching device Q4. Other configurations of FIG. 24 are the same as those of FIG. 20.

Figure 25:
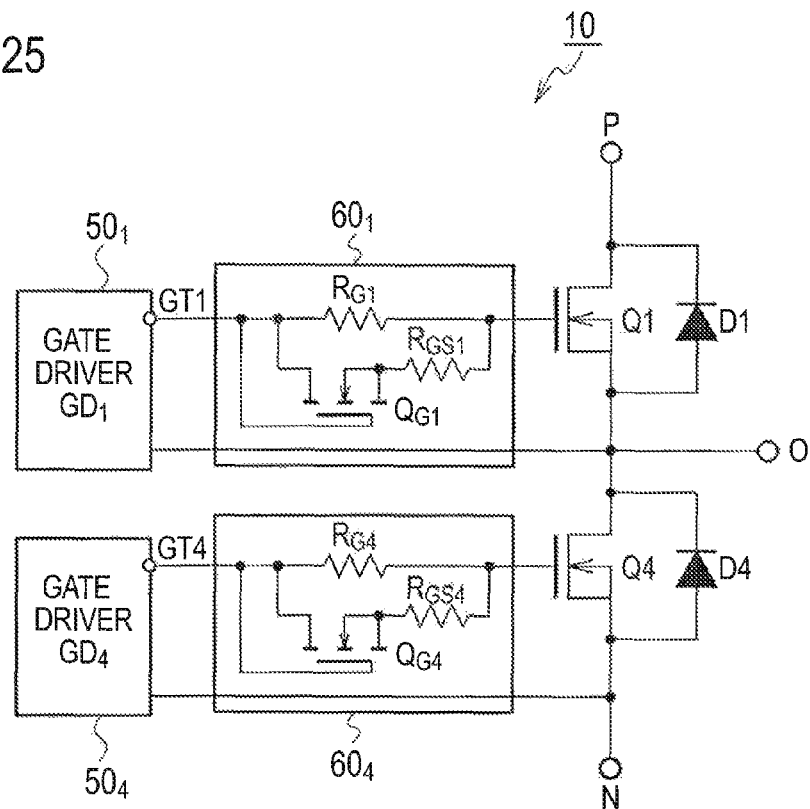
FIG. 25 is a schematic circuit configuration diagram of a half bridge circuit including a gate resistance $R_{G1}$, a gate switching device $Q_{G1}$, and a series resistance $R_{GS1}$ as the gate drive circuit $GC_1$, and a gate resistance $R_{G4}$, a gate switching device $Q_{G4}$, and a series resistance $R_{GS4}$ as the gate drive circuit $GC_4$, in a power supply according the embodiment.

FIG. 25 shows a schematic circuit configuration of the half bridge circuit including the gate resistance $R_{G1}$, the first gate switching device $Q_{G1}$, and the series resistance $R_{GS1}$ as the gate drive circuit $60_1$, and the gate resistance $R_{G4}$, the second gate switching device $Q_{G4}$, and series resistance $R_{GS4}$ as the gate drive circuit $60_4$, in the power supply 10 according the embodiment.

As shown in FIG. 25, the gate drive circuit $60_1$ in the power supply 10 according the embodiment includes a first series resistance $R_{GS1}$ connected in series to the first gate switching device $Q_{G1}$, wherein a series circuit including the first gate switching device $Q_{G1}$ and the series resistance $R_{GS1}$ is connected in parallel to the gate resistance $R_{G1}$. Similarly, the gate drive circuit $60_4$ includes a second series resistance $R_{GS4}$ connected in series to the second gate switching device $Q_{G4}$, wherein a series circuit including the second gate switching device $Q_{G4}$ and the series resistance $R_{GS4}$ is connected in parallel to the gate resistance $R_{G4}$. Other configurations of FIG. 25 are the same as those of FIG. 24.

Figure 26:
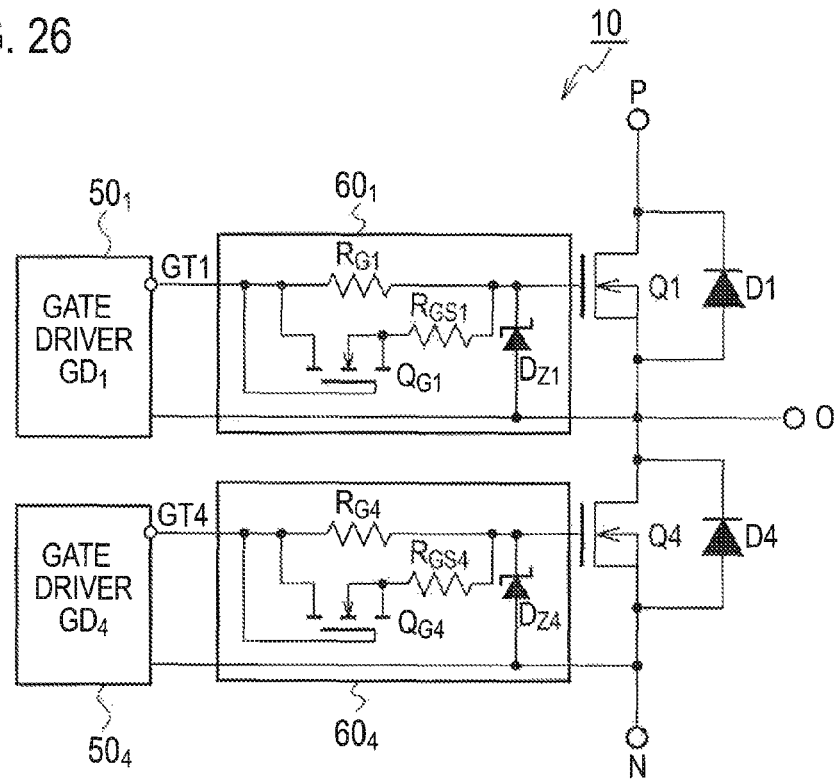
FIG. 26 is a schematic circuit configuration diagram of a half bridge circuit including a gate resistance $R_{G1}$, a gate switching device $Q_{G1}$, and a Zener diode $D_{Z1}$ as the gate drive circuit $GC_1$, and a gate resistance $R_{G4}$, a gate switching device $Q_{G4}$, and a Zener diode $D_{Z4}$ as the gate drive circuit $GC_4$, in a power supply according the embodiment.

FIG. 26 shows a schematic circuit configuration of the half bridge circuit including the gate resistance $R_{G1}$, the first gate switching device $Q_{G1}$, and the Zener diode $D_{Z1}$ as the gate drive circuit $60_1$, and the gate resistance $R_{G4}$, the second gate switching device $Q_{G4}$, and Zener diode $D_{Z4}$ as the gate drive circuit $60_4$, in the power supply 10 according the embodiment.

As shown in FIG. 26, the gate drive circuit $60_1$ in the power supply 10 according the embodiment includes a voltage limiting Zener diode $D_{Z1}$ connected in parallel between the gate and the source of the first gate switching device Q1. Similarly, the gate drive circuit $60_4$ includes a voltage limiting Zener diode $D_{Z4}$ connected in parallel between the gate and the source of the second switching device Q4.

In the embodiment, the voltage limiting Zener diode $D_{Z1}$ is disposed closer to the gate side of the first switching device Q1 than the first gate switching device $Q_{G1}$, the gate resistance $R_{G1}$, and the series resistance $R_{GS1}$. Similarly, the voltage limiting Zener diode $D_{Z4}$ is disposed closer to the gate side of the second switching device Q4 than the second gate switching device $Q_{G4}$, the gate resistance $R_{G4}$, and the series resistance $R_{GS4}$. Other configurations of FIG. 26 are the same as those of FIG. 24.

Figure 27:
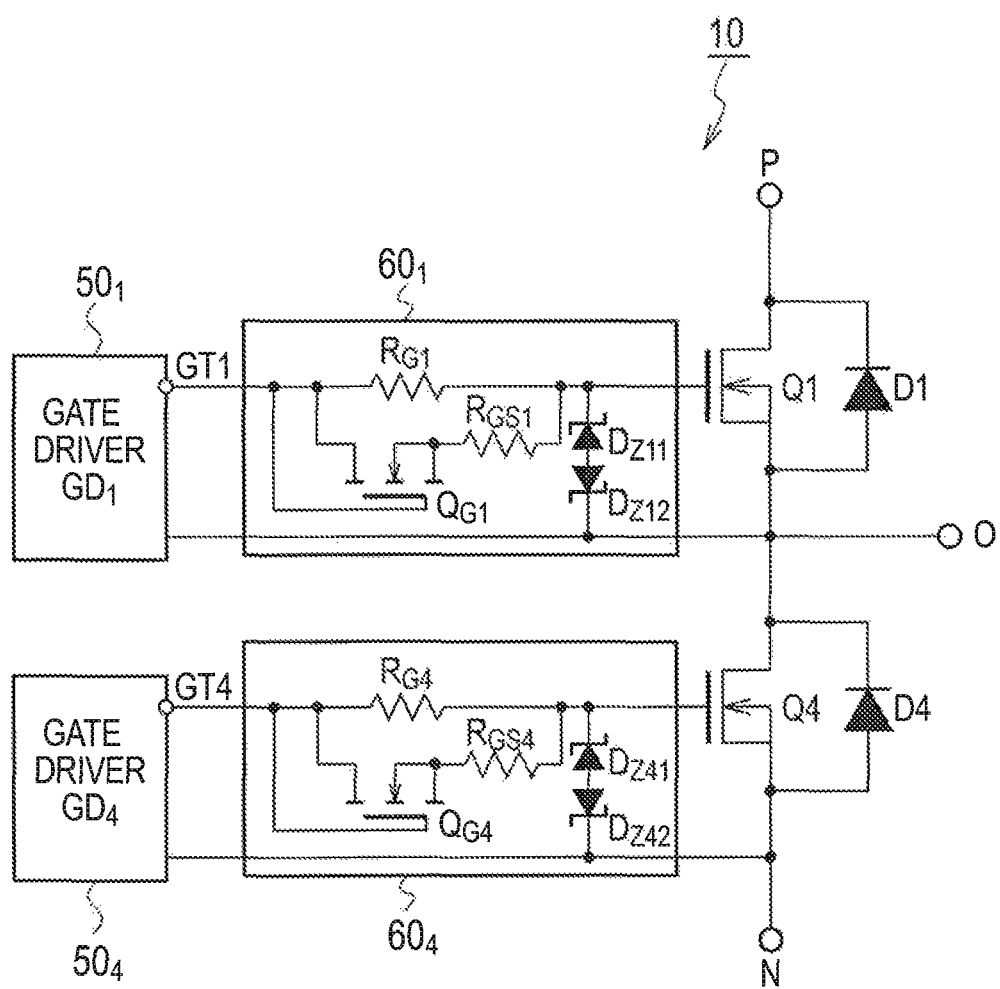
FIG. 27 is a schematic circuit configuration diagram of a half bridge circuit including a gate resistance $R_{G1}$, a gate switching device $Q_{G1}$, and Zener diodes $D_{Z11}$, $D_{Z12}$ as the gate drive circuit $GC_1$, and a gate resistance $R_{G4}$, a gate switching device $Q_{G4}$, and Zener diodes $D_{Z41}$, $D_{Z42}$ as the gate drive circuit $GC_4$, in a power supply according the embodiment.

FIG. 27 shows a schematic circuit configuration of the half bridge circuit including the gate resistance $R_{G1}$, the first gate switching device $Q_{G1}$, and the Zener diodes $D_{Z11}$ $D_{Z12}$ as the gate drive circuit $60_1$, and the gate resistance $R_{G4}$, the second gate switching device $Q_{G4}$, and Zener diodes $D_{Z41}$, $D_{Z42}$ as the gate drive circuit $60_4$, in the power supply 10 according the embodiment.

As shown in FIG. 27, the gate drive circuit $60_1$ in the power supply 10 according the embodiment includes the voltage limiting Zener diodes $D_{Z11}$, $D_{Z12}$ of serial structure connected in parallel between the gate and the source of the first gate switching device Q1. Similarly, the gate drive circuit $60_4$ includes the voltage limiting Zener diodes $D_{Z41}$, $D_{Z42}$ of serial structure connected in parallel between the gate and the source of the second switching device Q4.

In the embodiment, the voltage limiting Zener diodes $D_{Z11}$, $D_{Z12}$ are disposed closer to the gate side of the first switching device Q1 than the first gate switching device $Q_{G1}$, the gate resistance $R_{G1}$ and the series resistance $R_{GS1}$. Similarly, the voltage limiting Zener diodes $D_{Z41}$, $D_{Z42}$ are disposed closer to the gate side of the second switching device Q4 than the second gate switching device $Q_{G4}$, the gate resistance $R_{G4}$, and the series resistance $R_{GS4}$. Other configurations of FIG. 27 are the same as those of FIG. 24.

(Example of Application Circuit to which Gate Drive Circuit is Applied)

—Boost Converter Circuit Having PFC Function—

Figure 28:
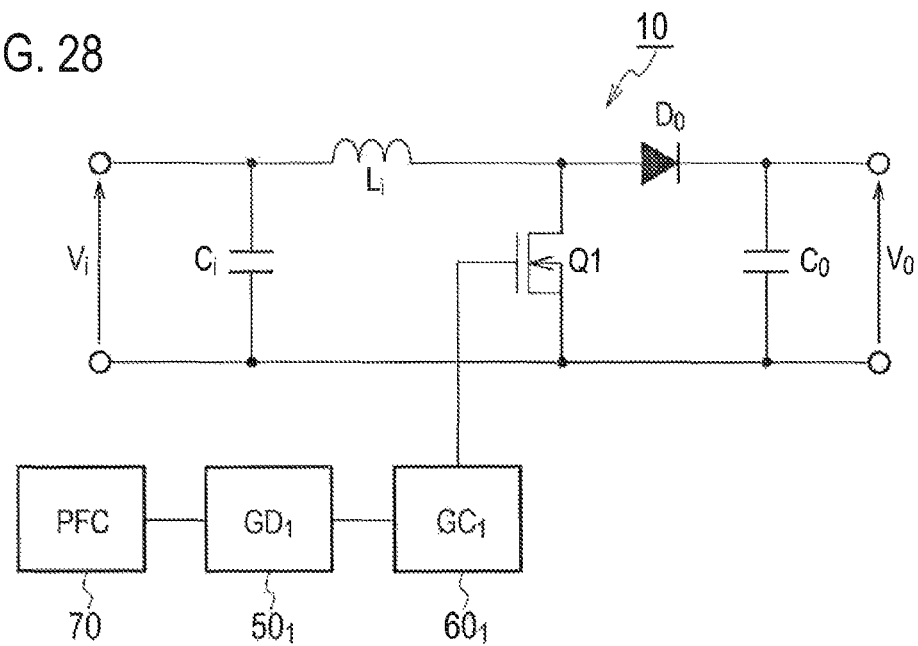
FIG. 28 is a schematic circuit configuration diagram of a boost converter circuit having PFC function to which the gate drive circuit is applied, in the power supply according to the embodiment.

As the power supply 10 according the embodiment, as shown in FIG. 28, a boost converter circuit having PFC function to which the gate drive circuit is applied includes: an input capacitor Ci connected between an input and ground potential; a switching device Q1 of which a source is connected to the ground potential; an inductance Li connected between a drain of the switching device Q1 and the input; a diode Do connected between the drain of a switching device Q1 and an output; an output capacitor Co connected between the output and the ground potential; a gate drive circuit $60_1$ connected to a gate of the switching device Q1; a gate driver $50_1$ connected to the gate drive circuit $60_1$; and a Power Factor Correction (PFC) circuit 70 connected to the gate driver $50_1$, wherein an input voltage Vi is boosted to an output voltage Vo, and a PFC function is also provided.

In the embodiment, the gate drive circuit according to the embodiment is applicable to the gate drive circuit $60_1$.

—H-Bridge Type Buck-Boost Converter Circuit—

Figure 29:
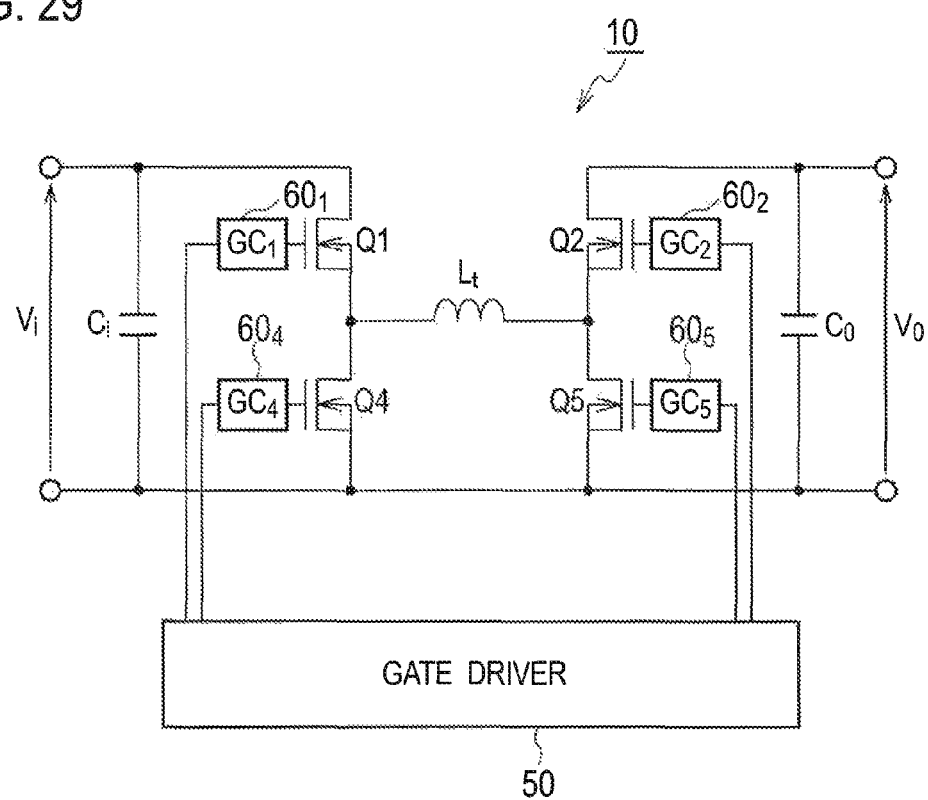
FIG. 29 is a schematic circuit configuration diagram of an H-bridge type buck-boost converter circuit to which the gate drive circuit is applied, in the power supply according to the embodiment.

As the power supply 10 according the embodiment, as shown in FIG. 29, an H-bridge type buck-boost converter circuit to which the gate drive circuit is applied includes: an input capacitor Ci connected between an input and ground potential; a first switching device Q1 and a second switching device Q4 of a first inverter configuration connected in parallel to the input capacitor Ci; an output capacitor Co connected between the output and the ground potential; a third switching device Q2 and a fourth switching device Q5 of a second inverter configuration connected in parallel to the output capacitor Co; an inductance Lt connected between a connecting point between the switching devices Q1, Q4 and a connecting point between the switching devices Q2, Q5; a first gate driving circuit ($GC_1$) $60_1$ configured to drive the switching device Q1, a second gate driving circuit ($GC_4$) $60_4$ configured to drive the switching device Q4, a third gate drive circuit ($GC_2$) $60_2$ configured to drive the switching device Q2, and a fourth gate drive circuit ($GC_5$) $60_5$ configured to drive the switching device Q5; and a gate driver 50 configured to drive the gate drive circuits $60_1$, $60_4$, $60_2$, $60_5$, wherein an input voltage Vi is bucked/boosted to an output voltage Vo.

The gate drive circuit according to the embodiment is applicable to the first gate driving circuit ($GC_1$) $60_1$, the second gate driving circuit ($GC_4$) $60_4$, the third gate drive circuit ($GC_2$) $60_2$, and the fourth gate drive circuit ($GC_5$) $60_5$.

—Flyback Type DC/DC Converter—

Figure 30:
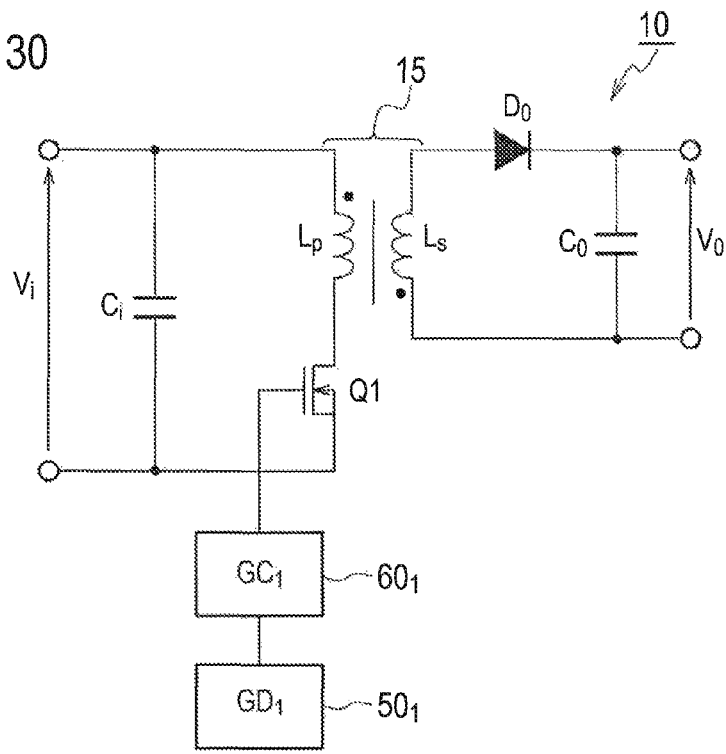
FIG. 30 is a schematic circuit configuration diagram of a flyback type DC/DC converter to which the gate drive circuit is applied, in the power supply according to the embodiment.

In the power supply 10 according the embodiment, as shown in FIG. 30, a flyback type DC/DC converter to which the gate drive circuit is applied includes: an input capacitor Ci connected between an input and ground potential; a flyback transformer 15 connected between the input and an output; a switching device Q1 connected between the input and the ground potential, the switching device Q1 connected in series to a primary-side inductance Lp of the flyback transformer 15; a diode Do of which an anode and a cathode are connected between a secondary-side inductance Ls of the flyback transformer 15 and the output; an output capacitor Co connected between the output and the ground potential; a gate drive circuit $60_1$ connected to a gate of the switching device Q1; and a gate driver $50_1$ connected to the gate drive circuit $60_1$, wherein an input voltage Vi is DC/DC converted into an output voltage Vo with flyback conversion.

The gate drive circuit according to the embodiment is applicable to the gate drive circuit $60_1$.

—Forward Type DC/DC Converter—

Figure 31:
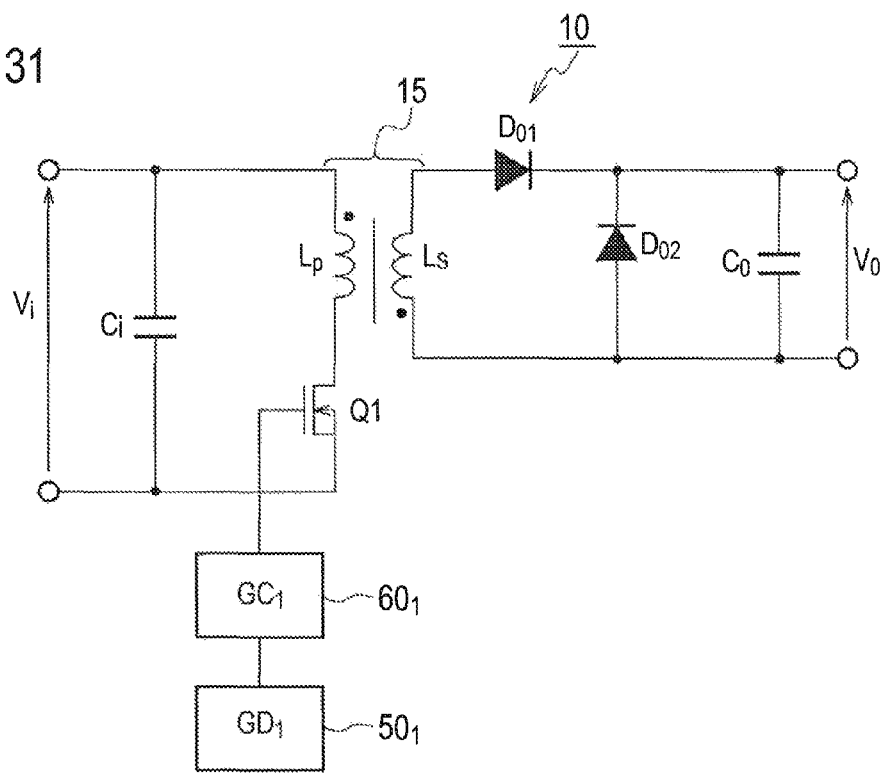
FIG. 31 is a schematic circuit configuration diagram of a forward type DC/DC converter to which the gate drive circuit is applied, in the power supply according to the embodiment.

In the power supply 10 according the embodiment, as shown in FIG. 31, a forward type DC/DC converter to which the gate drive circuit is applied includes: an input capacitor Ci connected between an input and ground potential; a flyback transformer 15 connected between the input and an output; a switching device Q1 connected between the input and the ground potential, the switching device Q1 connected in series to a primary-side inductance Lp of the flyback transformer 15; a first diode Do1 and an inductance Lo connected between a secondary-side inductance Ls of the flyback transformer 15 and the output; a second diode Do2 connected between a connecting point between the first diode Do1 and the inductance Lo, and the ground potential; an output capacitor Co connected between the output and the ground potential; a gate drive circuit $60_1$ connected to a gate of the switching device Q1; and a gate driver $50_1$ connected to the gate drive circuit $60_1$, wherein an input voltage Vi is DC/DC converted into an output voltage Vo with flyback conversion.

The gate drive circuit according to the embodiment is applicable to the gate drive circuit $60_1$.

—Full-Bridge Type Inverter Circuit—

Figure 32:
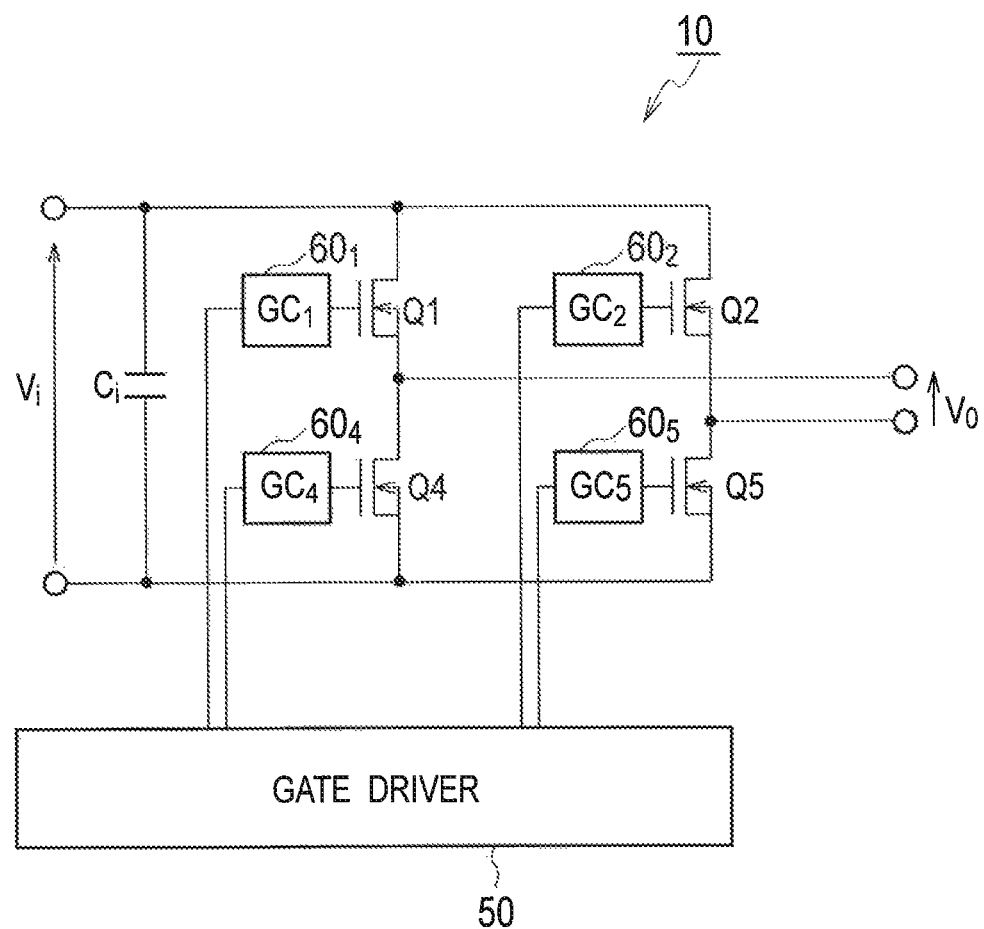
FIG. 32 is a schematic circuit configuration diagram of a full-bridge type inverter circuit to which the gate drive circuit is applied, in the power supply according to the embodiment.

In the power supply 10 according the embodiment, as shown in FIG. 32, a full-bridge type inverter circuit to which the gate drive circuit is applied includes: an input capacitor Ci connected between an input and ground potential; a first switching device Q1 and a second switching device Q4 of a first inverter configuration connected in parallel to the input capacitor Ci; a third switching device Q2 and a fourth switching device Q5 of a second inverter configuration connected in parallel to the input capacitor Ci; a first gate driving circuit ($GC_1$) $60_1$ configured to drive the switching device Q1, a second gate driving circuit ($GC_4$) $60_4$ configured to drive the switching device Q4, a third gate drive circuit ($GC_2$) $60_2$ configured to drive the switching device Q2, and a fourth gate drive circuit ($GC_5$) $60_5$ configured to drive the switching device Q5; and a gate driver 50 configured to drive the gate drive circuits $60_1$, $60_4$, $60_2$, $60_5$, wherein an input voltage Vi is converted into an output voltage Vo which can be obtained from between a connecting point between the switching devices Q1, Q4, and a connecting point between the switching devices Q2, Q5.

The gate drive circuit according to the embodiment is applicable to the first gate driving circuit ($GC_1$) $60_1$, the second gate driving circuit ($GC_4$) $60_4$, the third gate drive circuit ($GC_2$) $60_2$, and the fourth gate drive circuit ($GC_5$) $60_5$.

—Three-Phase AC Inverter—

Figure 33:
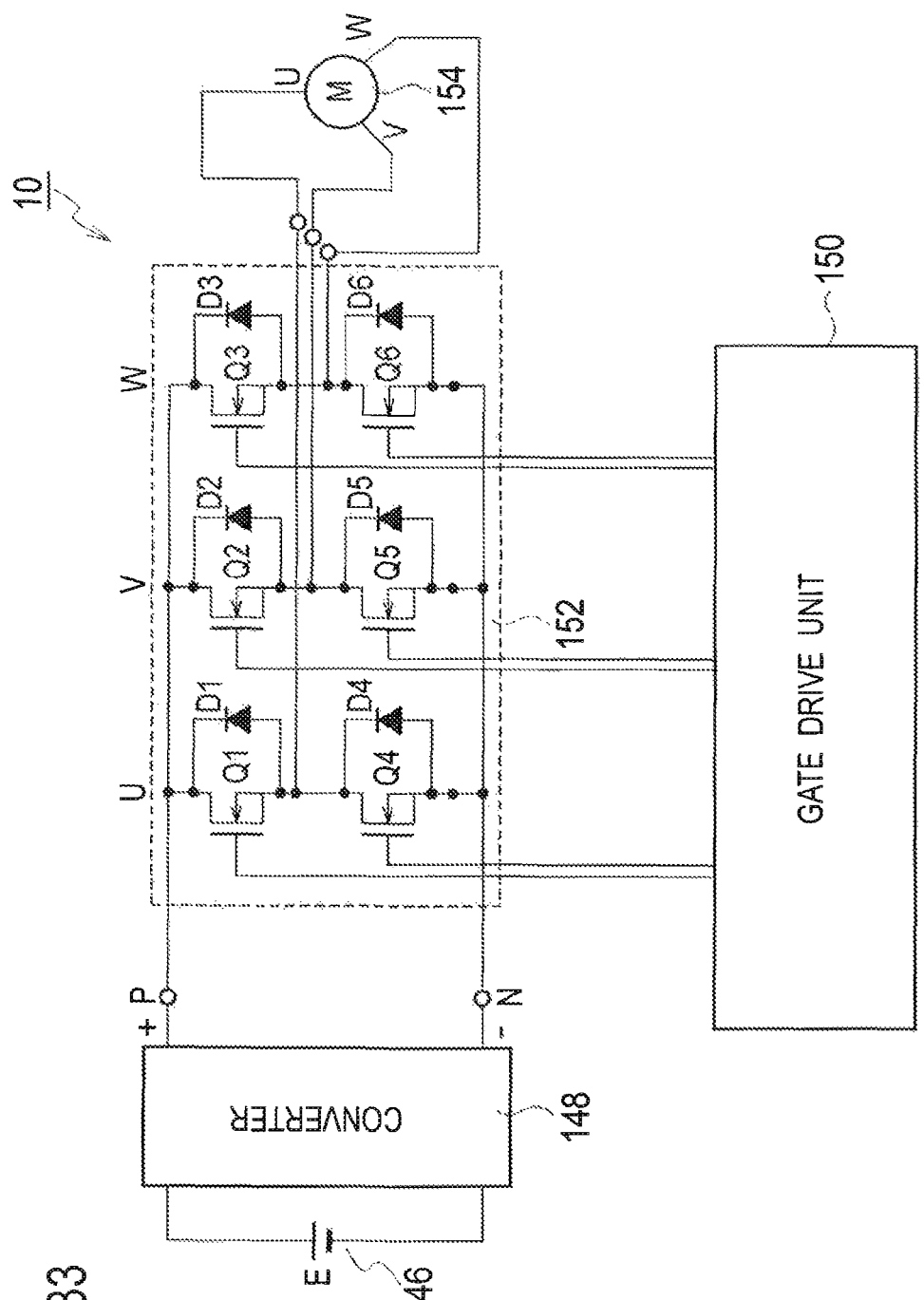
FIG. 33 is a schematic circuit configuration diagram of a three-phase Alternating Current (AC) inverter for driving a three-phase Alternating Current (AC) motor to which the gate drive circuit can be applied, in the power supply according to the embodiment.

FIG. 33 shows a schematic circuit configuration of a three-phase AC inverter for driving a three-phase AC motor to which the gate drive circuit can be applied, in the power supply 10 according to the embodiment. In FIG. 33, an SiC based device and a GaN based device are applicable as a switching device.

As shown in FIG. 33, the three-phase AC inverter includes a gate drive unit 150, a power module unit 152 connected to the gate drive unit 150, and a three-phase AC motor unit 154. U-phase, V-phase, and W-phase inverters are respectively connected to the three-phase AC motor unit 54 so as to correspond to U phase, V phase, and W phase of the three-phase AC motor unit 154, in the power module unit 152. In the embodiment, the gate drive unit 150 is connected to switching devices Q1, Q4, switching devices Q2, Q5, and switching devices Q3, Q6.

In the power module unit 152, the switching devices Q1, Q4, the switching devices Q2, Q5, and the switching devices Q3, Q6 having inverter configuration are connected between a positive-side power terminal P and a negative-side power terminal N. A converter 148 is connected to the positive-side power terminal P and the negative-side power terminal N, and a storage battery (E) 146 is connected to the converter 148. Furthermore, snubber diodes D1, D4, snubber diodes D2, D5, and snubber diodes D3, D6 respectively are connected reversely in parallel between the sources and the drains of the switching devices Q1, Q4, the switching devices Q2, Q5, and the switching devices Q3, Q6.

Figure 34:
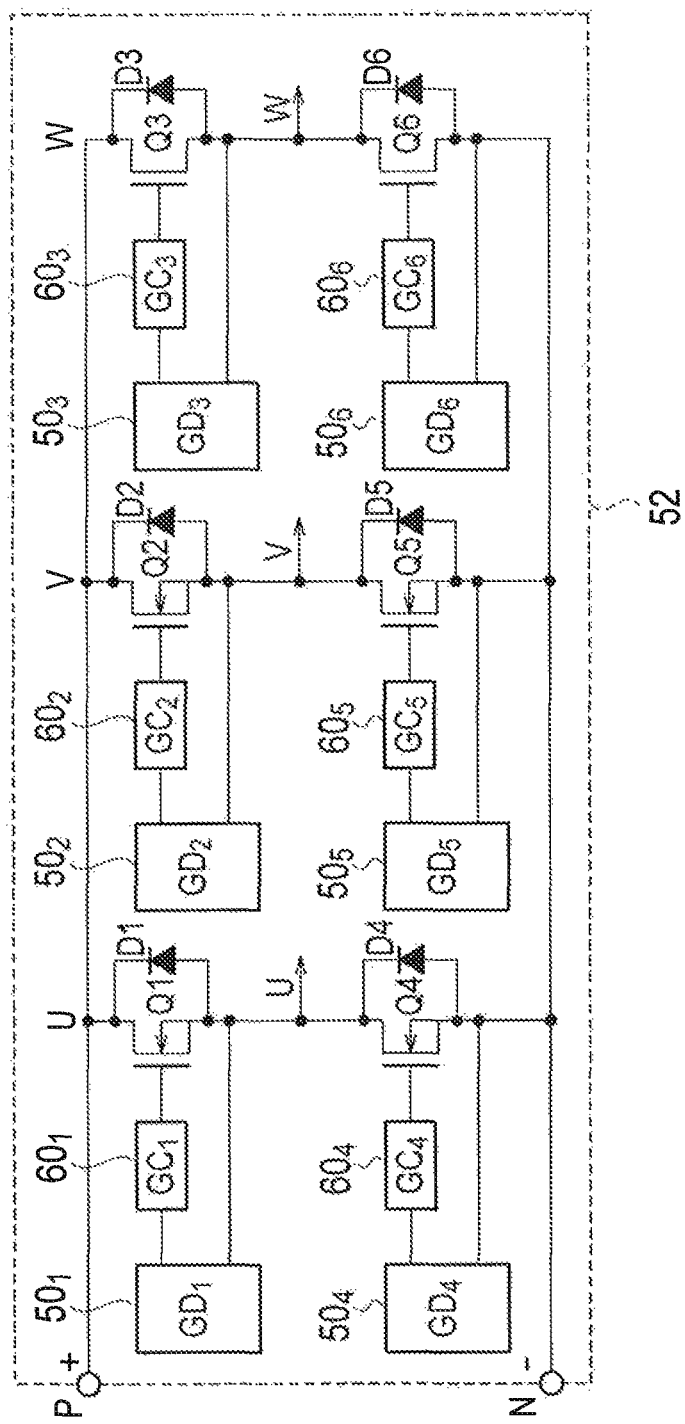
FIG. 34 is a detailed circuit configuration diagram of the three-phase AC inverter portion into which the gate drive unit and the power module unit are integrated, in FIG. 33.

Moreover, FIG. 34 shows a detailed circuit configuration of the three-phase AC inverter portion 52 into which the gate drive unit 150 and the power module unit 152 are integrated, in FIG. 33.

As shown in FIG. 34, in the three-phase AC inverter portion 52, the switching devices Q1, Q4 forming the U-phase inverter, the switching devices Q2, Q5 forming the V phase inverter, and the switching devices Q3, Q6 forming the W phase inverter are respectively connected between the negative (−) terminals N and the positive (+) terminal P.

A first gate driving circuit (GC$_1$) 60$_1$ and a second gate driving circuit (GC$_4$) 60$_4$ are connected to a gate of the switching devices Q1, Q4, and a first gate driver (GD$_1$) 50$_1$ and a second gate driver (GD$_4$) 50$_4$ are connected to the first gate driving circuit 60$_1$ and the second gate driving circuit 60$_4$. A third gate drive circuit (GC$_2$) 60$_2$ and a fourth gate drive circuit (GC$_5$) 60$_5$ are connected to a gate of the switching devices Q2, Q5, and a third gate driver (GD$_2$) 50$_2$ and a fourth gate driver (GD$_5$) 50$_5$ are connected to the third gate drive circuit 60$_2$ and the fourth gate drive circuit 60$_5$. A fifth gate drive circuit (GC$_3$) 60$_3$ and a sixth gate drive circuit (GC$_6$) 60$_6$ are connected to a gate of the switching devices Q3, Q6, and a fifth gate driver (GD$_3$) 50$_3$ and a sixth gate driver (GD$_6$) 50$_6$ are connected to the fifth gate drive circuit 60$_3$ and the sixth gate drive circuit 60$_6$. The gate drive circuit according to the embodiment is applicable to the first gate driving circuit (GC$_1$) 60$_1$, the second gate drive circuit (GC$_4$) 60$_4$, the third gate drive circuit (GC$_2$) 60$_2$, the fourth gate drive circuit (GC$_5$) 60$_5$, the fifth gate drive circuit 60$_3$, and the sixth gate drive circuit 60$_6$.

The gate drive circuit and the power supply according to the embodiment are applicable to HEV/EV to which the SiC power module is applied, converters suitable for motors built-in wheel (Power Factor Correction (PFC) circuits for boosting from batteries or three-phase inverter circuits for motor driving), step-up (boost) converters used for power conditioners of solar battery systems, converters and inverters for industrial equipment, etc.

According to the embodiment, there can be provided the gate drive circuit having high speed switching performance in which the misoperation associated with the rise of the gate voltage which is not intended is suppressed while the gate resistance is provided; and the power supply mounted with such a gate drive circuit.

As explained above, according to the embodiment, there can be provided the gate drive circuit having high speed switching performance in which the misoperation is suppressed and the surge voltage is reduced; and the power supply mounted with such a gate drive circuit.

Other Embodiments

As explained above, the embodiment has been described, as a disclosure including associated description and drawings to be construed as illustrative, not restrictive. This disclosure makes clear a variety of alternative embodiment, working examples, and operational techniques for those skilled in the art.

Such being the case, the embodiment covers a variety of embodiments, whether described or not.

INDUSTRIAL APPLICABILITY

The gate drive circuit and the power supply according to the embodiment are available to transistor drive circuits of whole of power devices, e.g. SiC power modules, intelligent power modules, and are applicable to in particular wide applicable fields, e.g., converters and inverters for HEV/EV, motors built-in wheel (PFC circuits and three phase inverter circuits for motor driving used for boosting from batteries), step-up (boost) converters used for power conditioners of solar battery systems, converters and inverters for industrial equipment, etc.

What is claimed is:

1. A gate drive circuit comprising:
   a gate resistance connected to a gate of a switching device; and
   a gated diode connected in parallel to the gate resistance, wherein
   a relationship of $V_{th}(Di) < V_{th}(Tr)$ is satisfied, where $V_{th}(Di)$ is a forward threshold voltage value of the gated diode, and $V_{th}(Tr)$ is a threshold voltage value of the switching device, and wherein the switching device comprises:
   a first-conductivity-type semiconductor layer including a front side surface and a back side surface opposite to the front side surface;
   a second-conductivity-type first region formed on the front side surface of the semiconductor layer, a part of the first region exposed from the front side surface of the semiconductor layer;
   a second-conductivity-type second region formed on the front side surface of the semiconductor layer so as to be separated from the first region, a part of the second region exposed from the front side surface of the semiconductor layer;
   a first-conductivity-type third region formed so as to be surrounded by the first region, a part of the third region exposed from the front side surface of the semiconductor layer;
   a first-conductivity-type fourth region formed so as to be surrounded by the second region, a part of the fourth region exposed from the front side surface of the semiconductor layer;
   a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film,
   a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

2. The gate drive circuit according to claim 1, wherein a relationship of $R_{on} < R_G$ is satisfied, where $R_{on}$ is a value of on-resistance of the switching device, and $R_G$ is a value of the gate resistance.

3. The gate drive circuit according to claim 1, wherein the gated diode is formed by using an SiC based or GaN based semiconductor device.

4. The gate drive circuit according to claim 1, further comprising:
a gate series resistance connected in series to the gated diode, wherein
a series circuit including the gated diode and the gate series resistance is connected in parallel to the gate resistance.

5. The gate drive circuit according to claim 1, further comprising:
a voltage limiting Zener diode connected in parallel between the gate and a source of the switching device.

6. A power supply comprising:
a first switching device of which a first drain is connected to a positive-side power terminal;
a second switching device having a second drain connected to a first source of the first switching device, the second drain connected to an output terminal, the second switching device further having a second source connected to a negative-side power terminal; and
a gate drive circuit comprising a gate resistance connected to both of or any one of a first gate of the first switching device and a second gate of the second switching device, and a gated diode connected in parallel to the gate resistance, wherein
a relationship of $V_{th}(Di) < V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

7. A power supply comprising:
a switching device configured to control an ON/OFF state;
a gate driver configured to drive the switching device by applying voltage to a gate of the switching device;
a gate resistance disposed between the gate and the gate driver; and
a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di) < V_{th}(Tr)$, and wherein the switching device comprises:
a first-conductivity-type semiconductor layer including a front side surface and a back side surface opposite to the front side surface;

a second-conductivity-type first region formed on the front side surface of the semiconductor layer, a part of the first region exposed from the front side surface of the semiconductor layer;

a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

8. The power supply according to claim 7, wherein a relationship of $R_G=Rgi+Rge$ is satisfied where $R_G$ is a value of gate resistance, Rgi is a value of internal resistance in the gate itself of the switching device, and Rge is a value of external resistance to be added.

9. The power supply according to claim 7, wherein a relationship of $R_{on}<R_G$ is satisfied, where $R_{on}$ is a value of on-resistance of the switching device, and $R_G$ is a value of the gate resistance.

10. The power supply according to claim 7, further comprising:
a first series resistance connected in series to the diode, wherein a series circuit including the diode and the series resistance is connected in parallel to the gate resistance.

11. The power supply according to claim 7, comprising:
a Zener diode connected between the gate and a source of the switching device, wherein
the Zener diode is disposed closer to a gate side of the switching device than the diode and the gate resistance.

12. The power supply according to claim 7, wherein the switching device and the gated diode are formed by using an SiC based or GaN based semiconductor device.

13. A PFC function boost converter comprising:
a power supply, wherein
the power supply comprises:
    a switching device configured to control an ON/OFF state;
    a gate driver configured to drive the switching device by applying voltage to a gate of the switching device;
    a gate resistance disposed between the gate and the gate driver; and
    a gated diode connected in parallel to the gate resistance, the gated diode connected between the gate and the gate driver so that an anode is at a gate side of the switching device and a cathode is at a gate driver side,
wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;

a second-conductivity-type first region formed on the front side surface of the semiconductor layer, a part of the first region exposed from the front side surface of the semiconductor layer;

a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

14. A power supply comprising:
a switching device configured to control an ON/OFF state;
a gate driver configured to drive the switching device by applying voltage to a gate of the switching device;
a gate resistance disposed between the gate and the gate driver;
a gated diode connected in parallel to the gate resistance, the gated diode connected between the gate and the gate driver so that an anode is at a gate side of the switching device and a cathode is at a gate driver side;
an inductance-capacitance connected between a drain and a source of the switching device; and
a load circuit connected in parallel to the capacitance, wherein
a relationship between a threshold voltage $V_{th}(Di)$ of the gated diode and a threshold voltage $V_{th}(Tr)$ of the switching device satisfy $V_{th}(Di) < V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

15. A flyback DC/DC converter comprising:
a power supply, wherein
the power supply comprises:
  a switching device configured to control an ON/OFF state;
  a gate driver configured to drive the switching device by applying voltage to a gate of the switching device;
  a gate resistance disposed between the gate and the gate driver; and
  a gated diode connected in parallel to the gate resistance, the gated diode connected between the gate and the gate driver so that an anode is at a gate side of the switching device and a cathode is at a gate driver side,
wherein
a relationship between a threshold voltage $V_{th}(Di)$ of the gated diode and a threshold voltage $V_{th}(Tr)$ of the switching device satisfy $V_{th}(Di) < V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

16. A forward type DC/DC converter comprising:
a power supply, wherein
the power supply comprises:
    a switching device configured to control an ON/OFF state;
    a gate driver configured to drive the switching device by applying voltage to a gate of the switching device;
    a gate resistance disposed between the gate and the gate driver; and
    a gated diode connected in parallel to the gate resistance, the gated diode connected between the gate and the gate driver so that an anode is at a gate side of the switching device and a cathode is at a gate driver side,
    wherein
    a relationship between a threshold voltage $V_{th}(Di)$ of the gated diode and a threshold voltage $V_{th}(Tr)$ of the switching device satisfy $V_{th}(Di)<V_{th}(Tr)$, and wherein
    the switching device comprises:
a first-conductivity-type semiconductor layer including a front side surface and a back side surface opposite to the front side surface;
    a second-conductivity-type first region formed on the front side surface of the semiconductor layer, a part of the first region exposed from the front side surface of the semiconductor layer;

a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

17. A full-bridge type inverter comprising:
a power supply, wherein
the power supply comprises:
    a switching device configured to control an ON/OFF state;
    a gate driver configured to drive the switching device by applying voltage to a gate of the switching device;
    a gate resistance disposed between the gate and the gate driver; and
    a gated diode connected in parallel to the gate resistance, the gated diode connected between the gate and the gate driver so that an anode is at a gate side of the switching device and a cathode is at a gate driver side,
wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film,
a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;
a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;
a second electrode connected to the first region, the second region, the third region, and the fourth region;
a first-conductivity-type fifth region formed on the back side surface of the semiconductor layer; and
a third electrode formed on the fifth region.

18. A three-phase AC inverter comprising:
a power supply, wherein
the power supply comprises:
a first switching device having a first drain connected to a positive-side power terminal;
a second switching device having a second drain connected to a first source of the first switching device, the second drain connected to an output terminal, the second switching device further having a second source connected to a negative-side power terminal;
a gate drive circuit comprising a gate resistance connected to both of or any one of a first gate of the first switching device and a second gate of the second switching device, and a gated diode connected in parallel to the gate resistance,
wherein
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film,
a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;
a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;
a second electrode connected to the first region, the second region, the third region, and the fourth region;

a first-conductivity-type fifth region formed on the back side surface of the semiconductor layer; and
a third electrode formed on the fifth region.

19. A gate power supply comprising:
a first switching device having a first drain connected to a positive-side power terminal;
a second switching device having a second drain connected to a first source of the first switching device, the second drain connected to an output terminal, the second switching device further having a second source connected to a negative-side power terminal;
a gate resistance connected to both of or any one of a first gate of the first switching device and a second gate of the second switching device; and
an inductance-capacitance connected between the second drain and the second source of the second switching device; and
a load circuit connected in parallel to the capacitance, wherein
a gated diode is connected in parallel to the gate resistance so that an anode is connected to the first or second gate, and
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film,
a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;
a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;
a second electrode connected to the first region, the second region, the third region, and the fourth region;
a first-conductivity-type fifth region formed on the back side surface of the semiconductor layer; and
a third electrode formed on the fifth region.

20. A gate drive circuit comprising:
a gate resistance connected to a gate of a switching device; and
a gated diode connected in parallel to the gate resistance, wherein
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device,
a relationship of $R_{on}<R_G$ is satisfied, where $R_{on}$ is a value of on-resistance of the switching device, and $R_G$ is a value of the gate resistance,
the switching device is formed by including an SiC-based semiconductor device,
the gate of the switching device is disposed at an upper portion of a drain region and a source region of the switching device, in a vertical direction, and
the gate is connected to the gated diode and the gate resistance, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a first insulating film formed on the front side surface of the semiconductor layer, a first surface of the first insulating film being formed to face a side of the semiconductor layer, a second surface of the first insulating film being formed to face a side opposite to the first surface of the first insulating film, a third surface of the first insulating film being located on the first region and the third region so as to connect between the first surface of the first insulating film and the second surface of the first insulating film, and a fourth surface of the first insulating film being located on the second region and the fourth region so as to connect between the first surface of the first insulating film and the second surface of the first insulating film, a first electrode formed on the first insulating film, a first surface of the first electrode being formed to face the front side surface of the semiconductor layer, a second surface of the first electrode being formed opposite to the first surface of the first electrode, a third surface of the first electrode connecting between the first surface of the first electrode and the second surface of the first electrode, and a fourth surface of first electrode connecting between the first surface of the first electrode and the second surface of the first electrode so as to oppose the third surface of the first electrode;

a second insulating film contacting the third surface of the first insulating film, the fourth surface of the first insulating film, the second surface of the first electrode, the third surface of the first electrode, and the fourth surface of the first electrode, the second insulating film formed by including a material different from a material of the insulating film;

a second electrode connected to the first region, the second region, the third region, and the fourth region;

a first-conductivity-type fifth region formed on the back side surface of the semiconductor layer; and a third electrode formed on the fifth region.

21. The gate drive circuit according to claim 20, wherein the source regions are respectively formed at edges of the gate, body regions having a conductivity type different from a conductivity type of the source regions are respectively formed so as to be connected to the source regions, the body regions are connected to a substrate of the switching device, and a lower portion of the substrate is connected to the drain region.

22. The gate drive circuit according to claim 21, wherein there are two body regions connected to the substrate, and a value of a channel resistance corresponding to a portion inserted into both body regions connected to substrate is smaller than the value $R_G$ of the gate resistance.

23. A gate drive circuit comprising:

a gate resistance connected to a gate of a switching device; and a gated diode connected in parallel to the gate resistance, wherein a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device, and wherein the switching device comprises:

a first-conductivity-type semiconductor layer including a front side surface and a back side surface opposite to the front side surface;

a second-conductivity-type first region formed on the front side surface of the semiconductor layer, a part of the first region exposed from the front side surface of the semiconductor layer;

a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a trench formed so as to pass through the first region and the second region, the trench extending to an inside of the semiconductor layer;

a first insulating film, an upper second insulating film, and a lower second insulating film, each formed in the trench;

a second-conductivity-type sixth region formed between the lower second insulating film and the semiconductor layer;

a first electrode formed in an inside of the first insulating film between the third region and the fourth region, so that the upper second insulating film covers an upper surface of the first electrode and the lower second insulating film covers a bottom surface of the first electrode;

a second electrode connected to the first region, the second region, the third region, and the fourth region;

a first-conductivity-type fifth region formed on the back side surface of the semiconductor layer; and a third electrode formed on the fifth region, wherein the lower second insulating film is formed in the inside of the semiconductor layer, and an upper surface of the lower second insulating film and an upper surface of the semiconductor layer are flush with each other.

24. A power supply comprising:

a first switching device having a first drain connected to a positive-side power terminal;

a second switching device having a second drain connected to a first source of the first switching device, the second drain connected to an output terminal, the second switching device further having a second source connected to a negative-side power terminal; and a gate drive circuit comprising a gate resistance connected to both of or any one of a first gate of the first switching device and a second gate of the second switching device, and a gated diode connected in parallel to the gate resistance, wherein a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:

a first-conductivity-type semiconductor layer including a front side surface and a back side surface opposite to the front side surface;

a second-conductivity-type first region formed on the front side surface of the semiconductor layer, a part of the first region exposed from the front side surface of the semiconductor layer;

a second-conductivity-type second region formed on the front side surface of the semiconductor layer so as to be separated from the first region, a part of the second region exposed from the front side surface of the semiconductor layer;

a first-conductivity-type third region formed so as to be surrounded by the first region, a part of the third region exposed from the front side surface of the semiconductor layer;

a first-conductivity-type fourth region formed so as to be surrounded by the second region, a part of the fourth region exposed from the front side surface of the semiconductor layer;

a trench formed so as to pass through the first region and the second region, the trench extending to an inside of the semiconductor layer;

a first insulating film, an upper second insulating film, and a lower second insulating film, each formed in the trench;

a second-conductivity-type sixth region formed between the lower second insulating film and the semiconductor layer;

a first electrode formed in an inside of the first insulating film between the third region and the fourth region, so that the upper second insulating film covers an upper surface of the first electrode and the lower second insulating film covers a bottom surface of the first electrode;

a second electrode connected to the first region, the second region, the third region, and the fourth region;

a first-conductivity-type fifth region formed on the back side surface of the semiconductor layer; and a third electrode formed on the fifth region, wherein the lower second insulating film is formed in the inside of the semiconductor layer, and an upper surface of the lower second insulating film and an upper surface of the semiconductor layer are flush with each other.

25. A power supply comprising:
a switching device configured to control an ON/OFF state;
a gate driver configured to drive the switching device by applying voltage to a gate of the switching device;
a gate resistance disposed between the gate and the gate driver; and
a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

26. A PFC function boost converter comprising:
a power supply, wherein
the power supply comprises:
a switching device configured to control an ON/OFF state;
a gate driver configured to drive the switching device by applying voltage to a gate of the switching device;
a gate resistance disposed between the gate and the gate driver; and
a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

27. A power supply comprising:
a switching device configured to control an ON/OFF state;
a gate driver configured to drive the switching device by applying voltage to a gate of the switching device;
a gate resistance disposed between the gate and the gate driver;
a gated diode connected in parallel to the gate resistance, the gated diode connected between the gate and the gate driver so that an anode is at a gate side of the switching device and a cathode is at a gate driver side;
an inductance-capacitance connected between a drain and a source of the switching device; and
a load circuit connected in parallel to the capacitance, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

28. A flyback DC/DC converter comprising:
a power supply, wherein
the power supply comprises:
a switching device configured to control an ON/OFF state;
a gate driver configured to drive the switching device by applying voltage to a gate of the switching device;
a gate resistance disposed between the gate and the gate driver; and
a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and a third electrode formed on the fifth region, wherein
the lower second insulating film is formed in the inside of the semiconductor layer, and an upper surface of the lower second insulating film and an upper surface of the semiconductor layer are flush with each other.

29. A forward type DC/DC converter comprising:
a power supply, wherein
the power supply comprises:
   a switching device configured to control an ON/OFF state;
   a gate driver configured to drive the switching device by applying voltage to a gate of the switching device;
   a gate resistance disposed between the gate and the gate driver; and
   a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

30. A full-bridge type inverter comprising:
a power supply, wherein
the power supply comprises:
   a switching device configured to control an ON/OFF state;
   a gate driver configured to drive the switching device by applying voltage to a gate of the switching device;
   a gate resistance disposed between the gate and the gate driver; and
   a gated diode connected in parallel to the gate resistance, the gated diode connected between the gate and the gate driver so that an anode is at a gate side of the switching device and a cathode is at a gate driver side, wherein
a relationship between a threshold voltage $V_{th}(Di)$ of the gated diode and a threshold voltage $V_{th}(Tr)$ of the switching device satisfy $V_{th}(Di)<V_{th}(Tr)$, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

31. A three-phase AC inverter comprising:
a power supply, wherein
the power supply comprises:
  a first switching having a first drain connected to a positive-side power terminal;
  a second switching device having a second drain connected to a first source of the first switching device, the second drain connected to an output terminal, the second switching device further having a second source connected to a negative-side power terminal;
  a gate drive circuit comprising a gate resistance connected to both of or any one of a first gate of the first switching device and a second gate of the second switching device, and a gated diode connected in parallel to the gate resistance, wherein
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

32. A gate power supply comprising:
a first switching device having a first drain connected to a positive-side power terminal;
a second switching device having a second drain connected to a first source of the first switching device, the second drain connected to an output terminal, the second switching device further having a second source connected to a negative-side power terminal;
a gate resistance connected to both of or any one of a first gate of the first switching device and a second gate of the second switching device; and
an inductance-capacitance connected between the second drain and the second source of the second switching device; and
a load circuit connected in parallel to the capacitance, wherein
a gated diode is connected in parallel to the gate resistance so that an anode is connected to the first or second gate, and
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the first and second switching devices, and wherein each of the first and second switching devices comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

33. A gate drive circuit comprising:
a gate resistance connected to a gate of a switching device; and
a gated diode connected in parallel to the gate resistance, wherein
a relationship of $V_{th}(Di)<V_{th}(Tr)$ is satisfied, where $V_{th}(Di)$ is a forward threshold voltage value of the gated diode, and $V_{th}(Tr)$ is a threshold voltage value of the switching device, wherein
a relationship of $R_{on}<R_G$ is satisfied, where $R_{on}$ is a value of on-resistance of the switching device, and $R_G$ is a value of the gate resistance, wherein
the switching device is formed by including an SiC-based semiconductor device, wherein
the gate of the switching device is disposed at an upper portion of a drain region and a source region of the switching device, in a vertical direction, and
the gate of the switching device is connected to the gated diode and the gate resistance, and wherein the switching device comprises:
a first-conductivity-type semiconductor layer including a front side surface and a back side surface opposite to the front side surface;
a second-conductivity-type first region formed on the front side surface of the semiconductor layer, a part of the first region exposed from the front side surface of the semiconductor layer;
a second-conductivity-type second region formed on the front side surface of the semiconductor layer so as to be separated from the first region, a part of the second region exposed from the front side surface of the semiconductor layer;
a first-conductivity-type third region formed so as to be surrounded by the first region, a part of the third region exposed from the front side surface of the semiconductor layer;
a first-conductivity-type fourth region formed so as to be surrounded by the second region, a part of the fourth region exposed from the front side surface of the semiconductor layer;
a trench formed so as to pass through the first region and the second region, the trench extending to an inside of the semiconductor layer;
a first insulating film, an upper second insulating film, and a lower second insulating film, each formed in the trench;
a second-conductivity-type sixth region formed between the lower second insulating film and the semiconductor layer;
a first electrode formed in an inside of the first insulating film between the third region and the fourth region, so that the upper second insulating film covers an upper surface of the first electrode and the lower second insulating film covers a bottom surface of the first electrode;
a second electrode connected to the first region, the second region, the third region, and the fourth region;
a first-conductivity-type fifth region formed on the back side surface of the semiconductor layer; and
a third electrode formed on the fifth region, wherein
the lower second insulating film is formed in the inside of the semiconductor layer, and an upper surface of the lower second insulating film and an upper surface of the semiconductor layer are flush with each other.

34. The gate drive circuit according to claim 33, wherein the source regions are respectively formed at edges of the gate, body regions having a conductivity type different from a conductivity type of the source regions are respectively formed so as to be connected to the source regions, the body regions are connected to a substrate of the switching device, and a lower portion of the substrate is connected to the drain region.

35. The gate drive circuit according to claim 34, wherein there are two body regions connected to the substrate, and a value of a channel resistance corresponding to a portion inserted into both body regions connected to the substrate is smaller than the value $R_G$ of the gate resistance.

* * * * *